(12) United States Patent
Bellaouar et al.

(10) Patent No.: US 12,706,621 B2
(45) Date of Patent: Aug. 11, 2026

(54) VARIABLE LOW INTERMEDIATE FREQUENCY (VLIF) RADIO ARCHITECTURE

(71) Applicant: QUALCOMM INCORPORATED, San Diego, CA (US)

(72) Inventors: Abdellatif Bellaouar, Richardson, TX (US); Kevin Hsi-Huai Wang, San Diego, CA (US); Gurkanwal Singh Sahota, Rancho Santa Fe, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 320 days.

(21) Appl. No.: 18/353,201

(22) Filed: Jul. 17, 2023

(65) Prior Publication Data

US 2025/0030442 A1 Jan. 23, 2025

(51) Int. Cl.
*H04B 1/00* (2006.01)
*H03F 3/24* (2006.01)
(Continued)

(52) U.S. Cl.
CPC ........... *H04B 1/0075* (2013.01); *H03F 3/245* (2013.01); *H04B 1/40* (2013.01); *H03F 2200/294* (2013.01); *H03F 2200/451* (2013.01)

(58) Field of Classification Search
None
See application file for complete search history.

(56) References Cited

U.S. PATENT DOCUMENTS 6,876,319 B2 * 4/2005 Webster ............. H03H 17/0657 341/61
7,035,661 B1 * 4/2006 Yun ....................... H04W 52/42 455/562.1
(Continued)

FOREIGN PATENT DOCUMENTS

CN 101741803 A 6/2010
WO 2020197691 A1 10/2020

OTHER PUBLICATIONS

GB 2405061, Al-Adnani Adnan, Great Britain, Mutirate Digital Transceiver, Feb. 16, 2005, whole document.*
(Continued)

*Primary Examiner* — Tuan A Tran
(74) *Attorney, Agent, or Firm* — Smith Tempel Blaha LLC

(57) ABSTRACT

A variable low intermediate frequency (VLIF), millimeter wave (mmW) communication system including a millimeter-wave (mmW) integrated circuit (mmw-IC) having a receive section having a receive radio frequency (RF) conversion stage and a receive variable intermediate frequency (IF) conversion stage, the receive RF conversion stage configured to convert a receive communication signal between RF and a first receive IF; the receive variable IF conversion stage configured to convert the first receive IF signal to a first variable low IF signal, and a transmit section having a transmit variable IF conversion stage and a transmit RF conversion stage, the transmit variable IF conversion stage configured to convert a second variable low IF signal to a second IF signal, the transmit RF conversion stage configured to convert the second IF signal to an RF signal for transmission.

25 Claims, 15 Drawing Sheets

(51) Int. Cl.

| | |
|---|---|
| ***H04B 1/04*** | (2006.01) |
| ***H04B 1/40*** | (2015.01) |
| ***H04B 1/74*** | (2006.01) |

(56) References Cited

U.S. PATENT DOCUMENTS

| | | | | |
|---|---|---|---|---|
| 7,593,491 | B1 * | 9/2009 | Khlat | H04B 1/406 455/192.2 |
| 7,778,345 | B2 * | 8/2010 | Sperlich | H03F 1/3247 375/296 |
| 7,783,263 | B2 * | 8/2010 | Sperlich | H04L 5/1469 370/278 |
| 8,412,132 | B2 * | 4/2013 | Tang | H03F 1/3247 455/114.2 |
| 8,532,583 | B2 * | 9/2013 | Beamish | H03L 7/0812 327/158 |
| 8,693,968 | B2 * | 4/2014 | Beamish | H03J 7/02 455/226.1 |
| 9,979,534 | B2 * | 5/2018 | Hiebert | H04B 7/0837 |
| 10,270,583 | B2 * | 4/2019 | Hiebert | H04L 7/02 |
| 11,664,832 | B1 * | 5/2023 | Puzzo | H04B 1/0096 375/262 |
| 2006/0281429 | A1 | 12/2006 | Kishi et al. | |

OTHER PUBLICATIONS

CN 115941012, Pan et al., China, Chip Configurable Elastic Scale Multi-beam Digital Array, May 12, 2023, whole document.*

Partial International Search Report and Written Opinion—PCT/US2024/034260—ISA/EPO—Nov. 4, 2024.

International Search Report and Written Opinion—PCT/US2024/034260—ISA/EPO—Feb. 12, 2025.

* cited by examiner

500

VLIF frequency example

| BW (MHz) | 100 | 200 | 400 | 600 | 800 |
|---|---|---|---|---|---|
| Fif (MHz) | 150 | 250 | 400 | 500 | 700 |
| Fmin of the BW (MHz) | 100 | 150 | 200 | 200 | 300 |
| Fmax of the BW (MHz) | 200 | 350 | 600 | 800 | 1100 |
| ADC Fs (GHz) | 0.6 | 1.0 | 1.6 | 2.0 | 2.8 |
| DAC Fs (GHz) | 1.2 | 2.0 | 3.2 | 4.0 | 5.6 |

*FIG. 5*

VARIABLE LOW INTERMEDIATE FREQUENCY (VLIF) RADIO ARCHITECTURE

FIELD

The present disclosure relates generally to electronics, and more specifically to an intermediate frequency (IF) architecture in a transceiver.

BACKGROUND

Wireless communication devices and technologies are becoming ever more prevalent, as are communication devices that operate at millimeter-wave (mmW) and sub-terahertz (subTHz) frequencies. Wireless communication devices generally transmit and/or receive communication signals. In a radio frequency (RF) transceiver, a communication signal is typically amplified and transmitted by a transmit section and a received communication signal is amplified and processed by a receive section. A transceiver for communication in 5G and 6G applications generally communicates using millimeter wave (mmW) frequency signals and sub-THz frequencies.

Transceivers used in some 5G communication systems generally use what is referred to as a superheterodyne (or Superhet) architecture, where a millimeter-wave radio frequency (RF) signal of, for example, approximately 24 gigahertz (GHz) to approximately 48 GHz received at a first integrated circuit (mmW-IC) is first downconverted to an intermediate frequency of, for example, 8 GHz to 14 GHZ, and the IF signal is then transferred to another IC where it is downconverted from the approximate 8 GHz to 14 GHz to baseband. Challenges with such an architecture include, for example, multiple different frequency translations (for example, from RF to IF and then from IF to baseband), which consumes valuable circuit area, and the need to transfer the IF signal from the mmW IC to another IC. Typically, these IF signals are transferred using cables. Such cables can be costly and may lead to signals loss. Further, the cost in circuit area becomes greater when new manufacturing processes are considered, such as the desire to use advanced 6 nanometer (nm) semiconductor processing technology or below.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a variable low intermediate frequency (VLIF), millimeter wave (mmW) communication system including a millimeter-wave (mmW) integrated circuit (mmw-IC) having a receive section having a receive radio frequency (RF) conversion stage and a receive variable intermediate frequency (IF) conversion stage, the receive RF conversion stage configured to convert a receive communication signal between RF and a first receive IF; the receive variable IF conversion stage configured to convert the first receive IF signal to a first variable low IF signal, and a transmit section having a transmit variable IF conversion stage and a transmit RF conversion stage, the transmit variable IF conversion stage configured to convert a second variable low IF signal to a second IF signal, the transmit RF conversion stage configured to convert the second IF signal to an RF signal for transmission.

Another aspect of the disclosure provides a method for processing communication signals including converting, at a millimeter wave integrated circuit (mmW-IC), a receive communication signal between a radio frequency (RF) and a first intermediate frequency (IF), and between the first IF and a first variable low IF (VLIF), and converting, at the mmW-IC, a transmit communication signal between a second variable low IF (VLIF) and a second IF, and between the second IF and RF.

Another aspect of the disclosure provides a device for processing communication signals including means for converting a receive communication signal between a radio frequency (RF) and a first intermediate frequency (IF), and between the first IF and a first variable low IF (VLIF), and means for converting a transmit communication signal between a second variable low IF (VLIF) and a second IF, and between the second IF and RF.

Another aspect of the disclosure provides a millimeter wave (mmW) communication system including a mixer configured to downconvert a receive communication signal to a complex variable low IF signal, a signal processing section configured to convert the complex variable low IF signal to a real signal, and a node configured to output the real signal to a cable.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 5 is a drawing of a table showing relationships between and among signal bandwidth and variable intermediate frequency.

DETAILED DESCRIPTION

The word "exemplary" is used herein to mean "serving as an example, instance, or illustration." Any aspect described herein as "exemplary" is not necessarily to be construed as preferred or advantageous over other aspects.

In accordance with an exemplary embodiment, a variable low intermediate frequency (VLIF) radio architecture may reduce millimeter-wave (mmW) overhead in an intermediate frequency integrated circuit (IFIC) by employing an RF sampling analog-to-digital converter (ADC) and a direct RF transmitter (RF-DAC), thus eliminating IF upconversion and downconversion.

In accordance with an exemplary embodiment, a variable low intermediate frequency (VLIF) radio architecture reduces design complexity in an IFIC by allowing the use of advanced semiconductor processing technologies, such as for example, 6 nm processing or below for the IFIC.

In accordance with an exemplary embodiment, a variable low intermediate frequency (VLIF) radio architecture eliminates an IF cable between a mmW-IC and an IFIC, thus reducing loss and reducing cost.

In accordance with an exemplary embodiment, a variable low intermediate frequency (VLIF) radio architecture may connect directly to a modem on a mobile device without an IFIC.

In accordance with an exemplary embodiment, a variable low intermediate frequency (VLIF) radio architecture avoids interference between the FR3 frequency band and the FR2 frequency band by eliminating IF conversion.

In accordance with an exemplary embodiment, in a variable low intermediate frequency (VLIF) radio architecture, the low IF is scalable with bandwidth.

In accordance with an exemplary embodiment, a variable low intermediate frequency (VLIF) radio architecture allows the radio to progress toward being a software defined radio (SDR).

Figure 1:
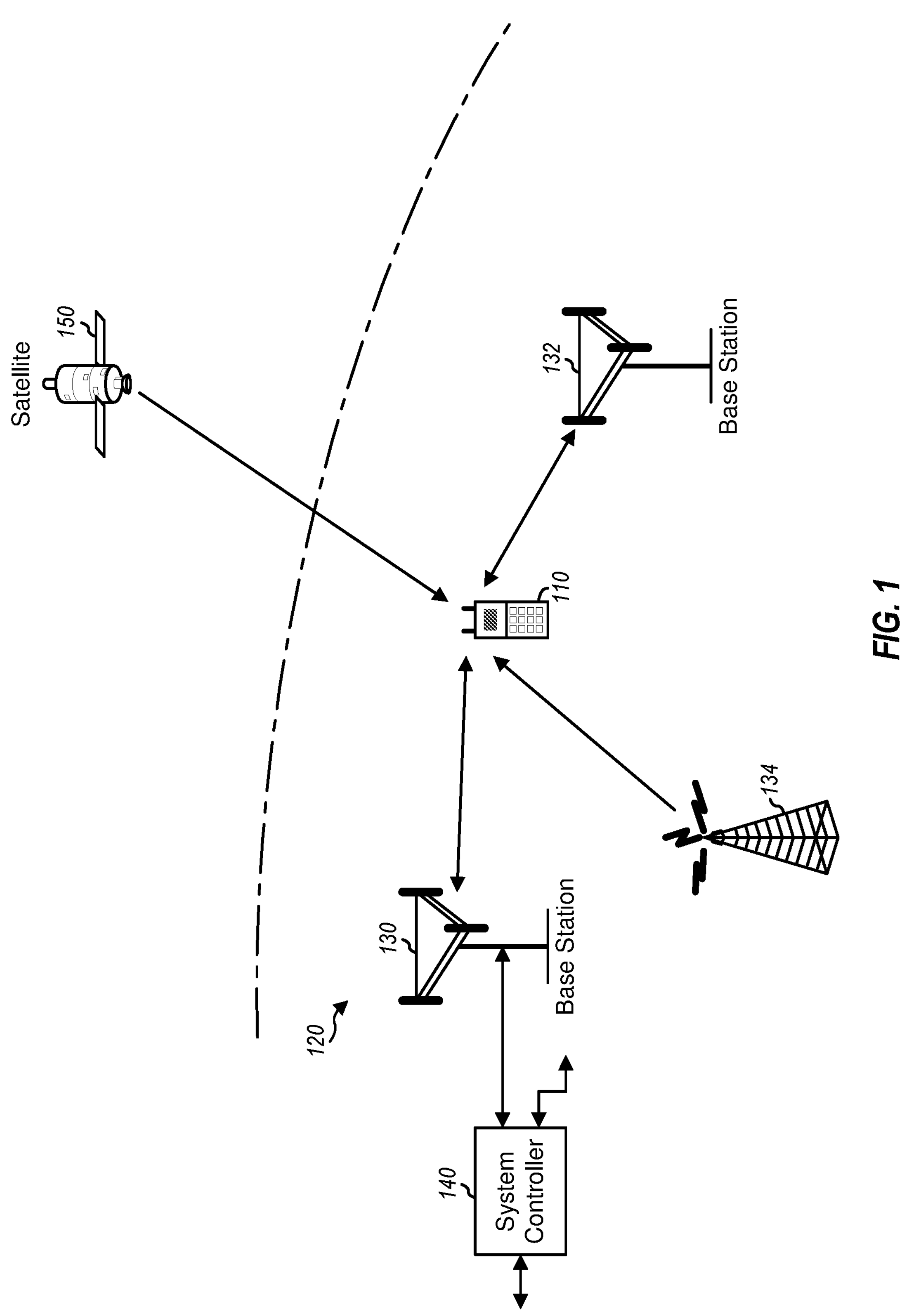
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc). Wireless device 110 may support one or more radio technologies for wireless communication such as LTE, WCDMA, CDMA 1X, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
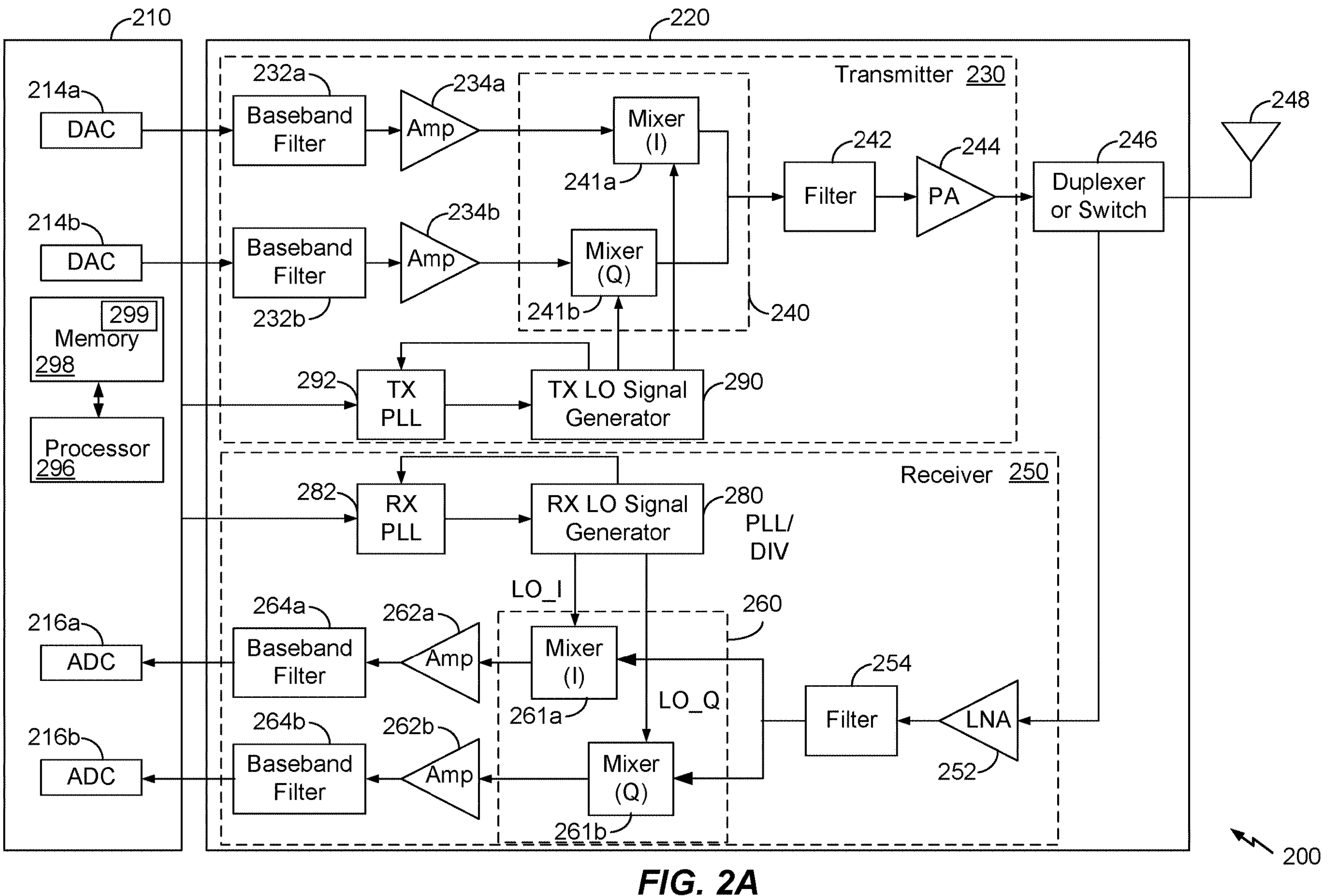
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the variable low IF circuits described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, baseband (e.g., lowpass) filters 232*a* and 232*b* filter the I and Q analog transmit signals, respectively, to remove undesired images caused by the prior digital-to-analog conversion. Amplifiers (Amp) 234*a* and 234*b* amplify the signals from baseband filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal.

Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by baseband (e.g., lowpass) filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
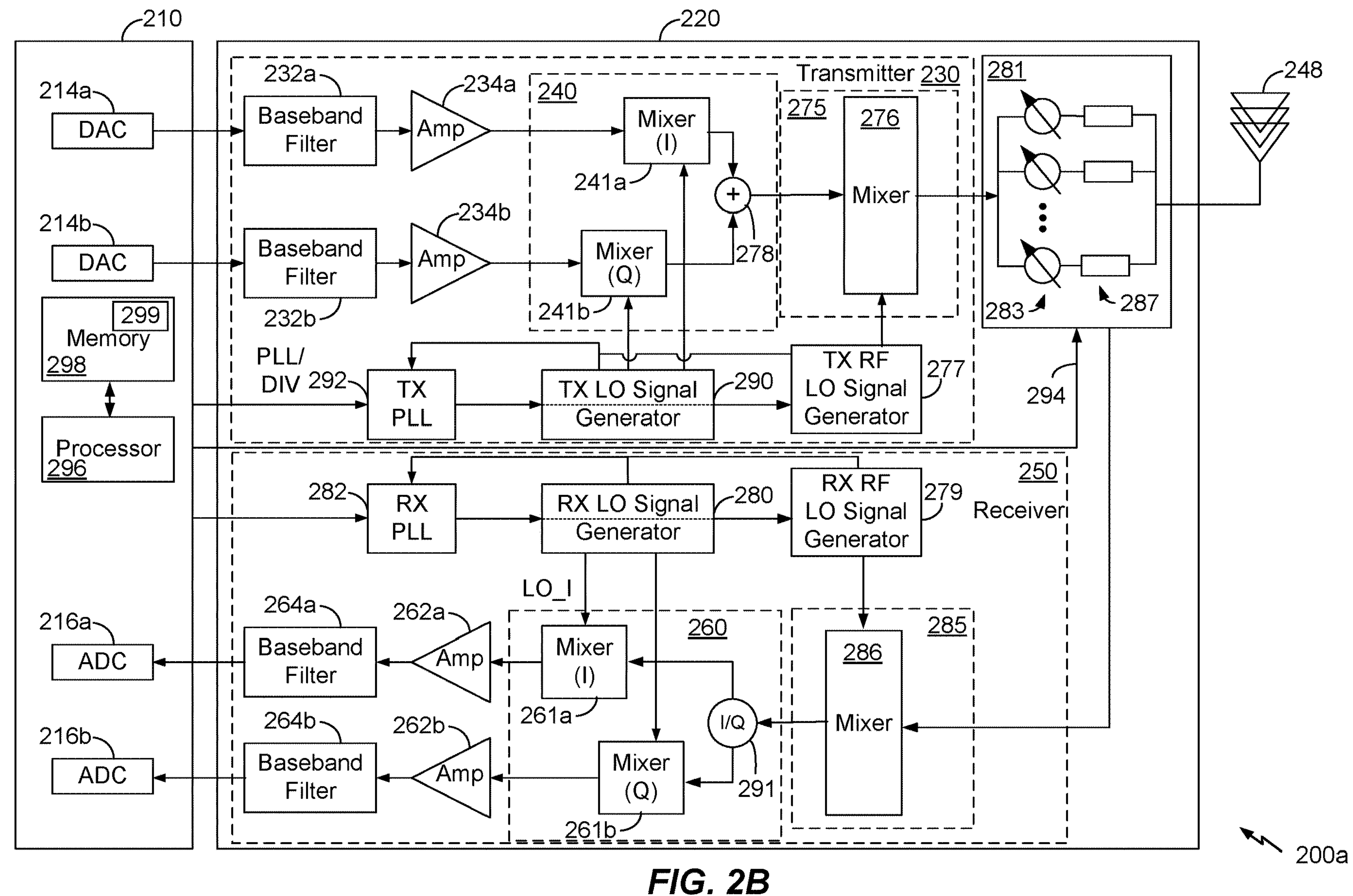
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200*a* in FIG. 2B may be configured similarly to those in the wireless device 200 shown in FIG. 2A and the description of identically numbered items in FIG. 2B will not be repeated.

The wireless device 200*a* is an example of a heterodyne (or superheterodyne) architecture in which the upconverter 240 and the downconverter 260 are configured to process a communication signal between baseband and an intermediate frequency (IF). The IF signal may be a low IF (LIF) signal, or a zero (or near zero) IF (ZIF) signal. For example, the upconverter 240 may include a summing function 278 and may be configured to provide an IF signal to an upconverter 275. In an exemplary embodiment, the upconverter 275 may comprise upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The downconverter 260 includes an I/Q generation function 291. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate. Some configurations described above may be able to be improved in terms of circuit area and/or signal loss, for example as introduced over a cable. Some examples described below may improve upon these aspects and may promote the implementation of relevant circuitry in smaller process nodes.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
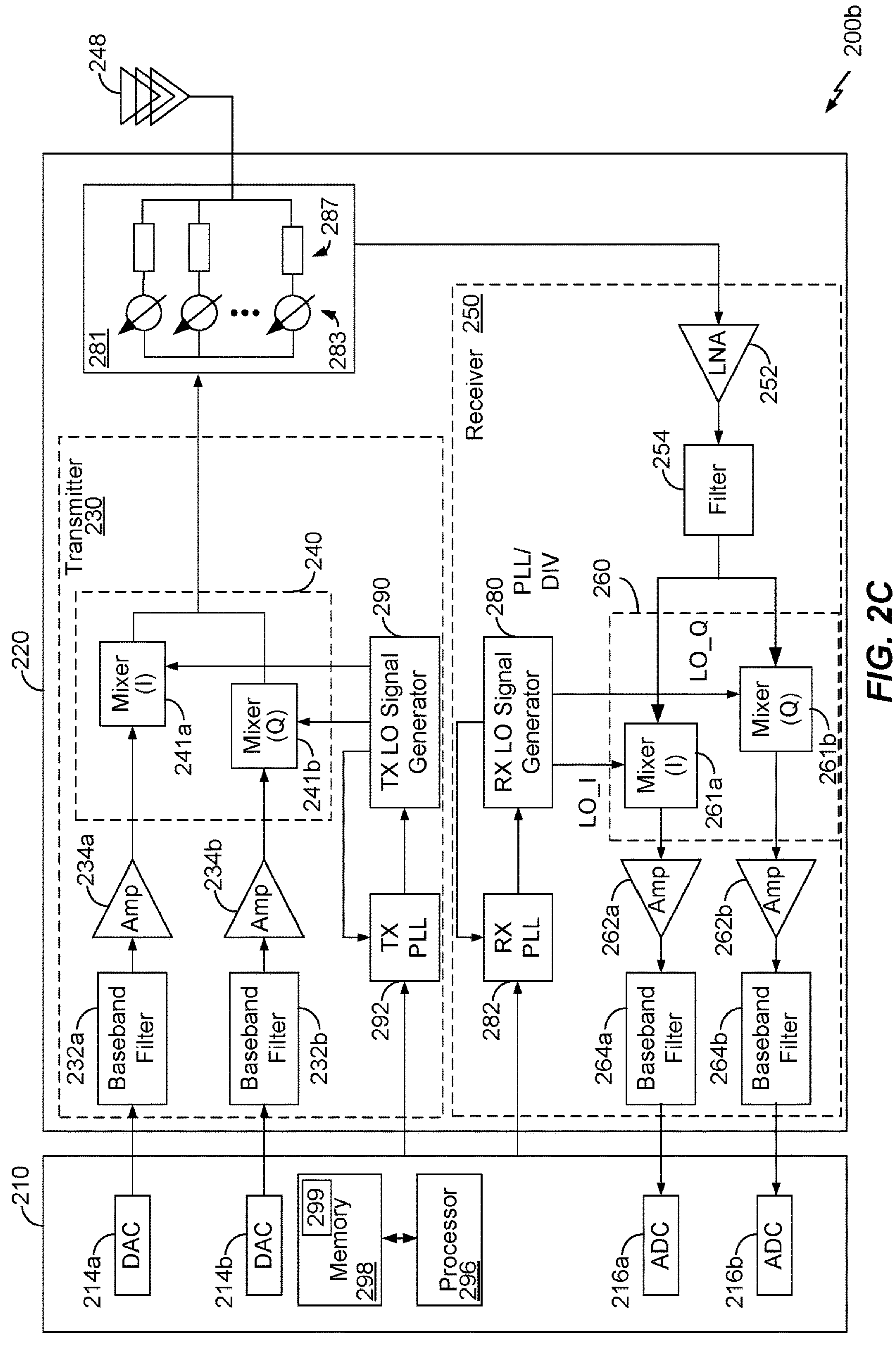
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200*b* in FIG. 2C may be configured similarly to those in the wireless device 200 shown in FIG. 2A and/or the wireless device **200*a* shown in FIG. 2B and the description of identically numbered items in FIG. 2**C will not be repeated.

The wireless device **200*b* in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. For example, the LO signals in the architecture of FIG. 2**C may comprise signals at frequencies of tens of GHz.

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

Figure 3A:
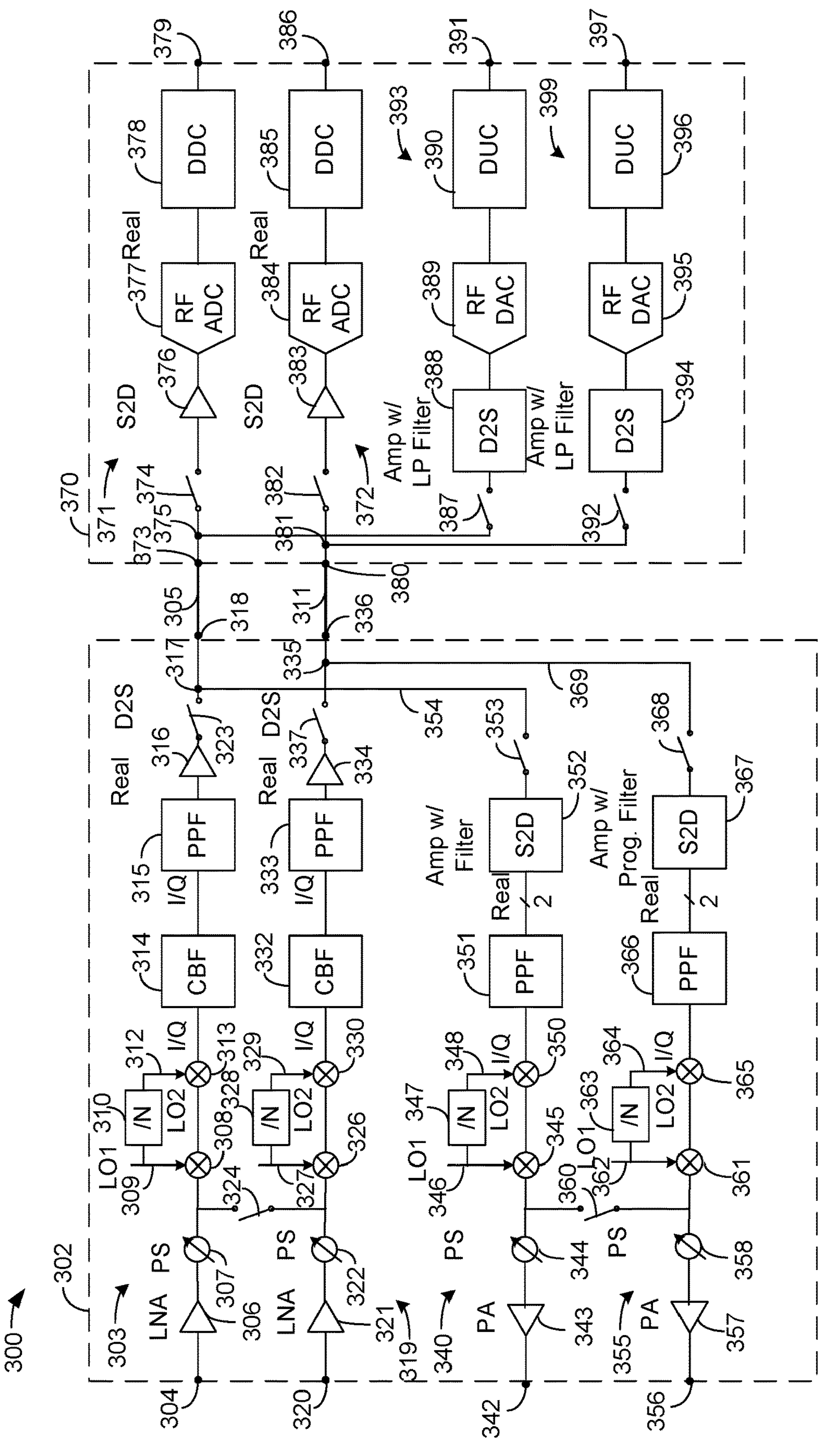
FIG. 3A is a block diagram of a millimeter wave integrated circuit (mmW-IC) and an intermediate frequency integrated circuit (IFIC) in accordance with an exemplary embodiment of the disclosure.

FIG. 3A is a block diagram 300 of a millimeter wave integrated circuit (mmW-IC) and an intermediate frequency integrated circuit (IFIC) in accordance with an exemplary embodiment of the disclosure. In an exemplary embodiment, a millimeter wave integrated circuit (mmW-IC) 302 may be connected to an intermediate frequency integrated circuit (IFIC) 370 via one or more IF cables 305 and 311.

In an exemplary embodiment, the mmW-IC 302 may comprise a number of receive paths and a number of transmit paths. Exemplary receive paths are shown using reference numerals 303 and 319 and exemplary transmit paths are shown using reference numerals 340 and 355.

In an exemplary embodiment, a receive path 303 may include a port 304. In an exemplary embodiment, while shown as a single element the port 304 may comprise multiple ports that may be coupled to one or more antennas, or may be coupled through a switching system (not shown) to one or more antennas. In an exemplary embodiment, the port 304 is shown as coupled to a low noise amplifier (LNA) 306 and the LNA 306 is shown as coupled to a phase shifter (PS) 307. Similar to the port 304, the LNA 306 and the PS 307 are shown as a single elements, but may comprise multiple LNAs and multiple phase shifters. In some embodiments, signals from multiple antennas, LNAs and phase shifters may be combined in a combiner (not shown) after the PS 307 and provided to a mixer 308. The phase shift circuitry 281 of FIGS. 2B and 2C may be an example implementation of the port 304, LNA 306 and phase shifter 307.

The PS 307 may be coupled to a mixer 308. In an exemplary embodiment, the mixer 308 may comprise a first downconverter, or a first downconverter stage and may be configured to downconvert a radio frequency (RF) signal provided by the PS 307 to a lower frequency. In an exemplary embodiment, the RF input signal to the mixer 308 may be at a millimeter wave (mmW) frequency of, for example, 24-48 gigahertz (GHz). In an exemplary embodiment, the mixer 308 may be configured to receive a local oscillator (LO) signal (LO1) over connection 309 from a frequency synthesizer (such as the RX LO signal generator 280 or 279 of FIG. 2B). In an exemplary embodiment, the mixer 308 may be configured to convert the mmW RF signal from the PS 307 to an intermediate frequency (IF) in the range of, for example, 3-5 GHz. The IF signal at an approximate frequency of 3-5 GHz may be referred to as a first IF signal. In an exemplary embodiment, the LO1 signal on connection 309 may be an integer LO signal and the mixer 308 may perform integer downconversion.

In an exemplary embodiment, the signal from the mixer 308 is provided to a mixer 313. In an exemplary embodiment, the mixer 313 may comprise a second downconverter, or a second downconverter stage and may be configured to downconvert the first IF signal provided by the mixer 308 to a first variable intermediate frequency. The LO1 signal on connection 309 may be divided by a divider 310 and provided as an LO2 signal on connection 312 to the mixer 313, as illustrated, or a separate LO (not illustrated) may be used. The divider 310 may be a fractional divider (divide by N) and the LO2 signal may be used by the mixer 313 to downconvert the 3-5 GHZ IF signal from the mixer 308 to a first variable intermediate frequency (IF), referred to herein as a first variable low intermediate frequency (VLIF) signal. In an exemplary embodiment, the first variable low intermediate frequency (VLIF) signal may have a frequency on the order of approximately 150 MHz to approximately 700 MHZ (depending on bandwidth). In another exemplary embodiment, the mixer 308 may be configured to directly downconvert the RF signal to a VLIF signal of approximately 150 MHz to approximately 700 MHz. In such an exemplary embodiment, the divider 310 and mixer 313 may be omitted. In some examples, converting between low IF and RF in two stages (for example pursuant to some configurations described herein) reduces noise.

The mixer 313 also performs a quadrature operation on the (real) output of the mixer 308 so that the output of the mixer 313 is a quadrature signal having an in phase (I) signal component and a quadrature (Q) signal component. The I and Q signals may be differential. If the mixer 313 is omitted in a direct conversion architecture, then the mixer 308 would perform the downconversion and the I/Q signal generation.

In an exemplary embodiment, the output of the mixer 313 is provided to a complex bandpass filter (CBF) 314. The CBF 314 filters the channel selected by the LO2 frequency and provides I and Q signals to polyphase filter (PPF) 315. The PPF 315 converts the complex I and Q signals from the CBF 314 to a real differential signal. The real differential signal is provided to an amplifier 316 that performs differential to single ended (D2S) conversion. The single ended signal at the first variable low IF is provided through a switch 323 to the node 317 and to the node 318 and from the node 318 to the IF cable 305. The node 318 may be an example of a port and/or pin, or other component or interface to the cable 305.

Although shown as being located in the mmW-IC 302, the PPF 315 may be implemented in the IFIC 370 in some embodiments. For example, the CBF 314 may be configured to provide the complex I/Q signals over the IF cable 305 and the PPF 315 may be digitally implemented in the IFIC 370.

In an exemplary embodiment, a receive path 319 is similar to the receive path 303. In an exemplary embodiment, the receive path 319 may include a port 320. In an exemplary embodiment, while shown as a single element the port 320 may comprise multiple ports that may be coupled to one or more antennas, or may be coupled through a switching system to one or more antennas. In an exemplary embodiment, the port 320 may share connections to the same array of antennas as the port 304. In some examples, the port 304 is coupled to receive signals having a first polarization and the port 320 is coupled to receive signals having a second polarization (e.g., from the same antenna) that is different from (e.g., orthogonal to) the first polarization. In some examples, the ports 304 and 320 are coupled to respective antennas configured for operation with different frequencies. In an exemplary embodiment, the port 320 is shown as coupled to a low noise amplifier (LNA) 321 and the LNA 321 is shown as coupled to a phase shifter (PS) 322. Similar to the port 320, the LNA 321 and the PS 322 are shown as a single elements, but may comprise multiple LNAs and multiple phase shifters. In some embodiments, signals from multiple antennas, LNAs and phase shifters may be combined in a combiner (not shown) after the PS 322 and provided to a mixer 326. The phase shift circuitry 281 of FIGS. 2B and 2C may be an example implementation of the port 320, LNA 321 and phase shifter 322. In an exemplary embodiment, the receive path 303 and the receive path 319 may be configured for single input, single output (SISO) operation or multiple input, multiple output (MIMO) operation. For example, in one example of SISO operation, a switch 324 may be conductive and a receive signal in either the receive path 303 or the receive path 319 is processed by the mixer 308 and downstream circuitry in the receive path 303 or by the mixer 326 and downstream circuitry in the receive path 319. In an example of MIMO operation, the switch 324 is nonconductive and a receive signal in the receive path 303 and the receive path 319 is processed by the mixer 308 and downstream circuitry in the receive path 303 and by the mixer 326 and downstream circuitry in the receive path 319, respectively. In an example of wideband SISO operation, the switch 324 may be conductive and a wideband receive signal is provided to both the receive path 303 and the receive path 319, where a portion of the wideband receive signal is processed by the mixer 308 and downstream circuitry in the receive path 303 and another portion of the wideband receive signal is processed by the mixer 326 and downstream circuitry in the receive path 319.

The PS 322 may be coupled to a mixer 326. In an exemplary embodiment, the mixer 326 may comprise a first downconverter, or a first downconverter stage and may be configured to downconvert a radio frequency signal provided by the PS 322 to a first intermediate frequency. In an exemplary embodiment, the RF input signal to the mixer 326 may be at a millimeter wave (mmW) frequency of, for example, 24-48 gigahertz (GHz). In an exemplary embodiment, the mixer 326 may be configured to receive a local oscillator (LO) signal (LO1) over connection 327 from a frequency synthesizer (such as the RX LO signal generator 280 or 279 of FIG. 2B). In an exemplary embodiment, the mixer 326 may be configured to convert the mmW RF signal from the PS 322 to a frequency in the range of, for example, 3-5 GHz. This signal in the range of approximately 3-5 GHz may be referred to as a first IF signal. In an exemplary embodiment, the LO1 signal on connection 327 may be an integer LO signal and the mixer 326 may perform integer downconversion.

In an exemplary embodiment, the signal from the mixer 326 is provided to a mixer 330. In an exemplary embodiment, the mixer 330 may comprise a second downconverter, or a second downconverter stage and may be configured to downconvert the first IF signal provided by the mixer 326 to a first variable low intermediate frequency. In an exemplary embodiment, the first variable low intermediate frequency (VLIF) signal may have a frequency on the order of approximately 150 MHz to approximately 700 MHz (depending on bandwidth).

The LO1 signal on connection 327 may be divided by a divider 328 and provided as an LO2 signal on connection 329 to the mixer 330, as illustrated, or a separate LO (not illustrated) may be used. The divider 328 may be a fractional divider (divide by N) and the LO2 signal may be used by the mixer 330 to downconvert the 3-5 GHz signal from the mixer 326 to a first variable intermediate frequency (IF) signal, referred to herein as a variable low intermediate frequency (VLIF) signal. In an exemplary embodiment, the first variable low intermediate frequency (VLIF) signal may have a frequency on the order of approximately 150 MHz to approximately 700 MHZ (depending on bandwidth). In another exemplary embodiment, the mixer 326 may be configured to directly downconvert the RF signal to a VLIF signal of approximately 150 MHz to approximately 700 MHz. In such an exemplary embodiment, the divider 328 and mixer 330 may be omitted.

The mixer 330 also performs a quadrature operation on the output of the mixer 326 so that the output of the mixer 330 is a quadrature signal having an in phase (I) signal component and a quadrature (Q) signal component. The I and Q signals are differential. If the mixer 330 is omitted in a direct conversion architecture, then the mixer 326 would perform the downconversion and the I/Q signal generation.

In an exemplary embodiment, the output of the mixer 330 is provided to a complex bandpass filter (CBF) 332. The CBF 332 filters the channel selected by the LO2 frequency and provides I and Q signals to polyphase filter (PPF) 333. The PPF 333 converts the I and Q signals from the CBF 332 to a real differential signal. The real differential signal is provided to an amplifier 334 that performs differential to single ended conversion. The single ended signal is provided through a switch 337 to the node 335 and to the node 336 and from the node 336 to the IF cable 311. The node 336 may be an example of a port and/or pin, or other component or interface to the cable 311.

In an exemplary embodiment, a transmit path 340 includes a programmable amplifier and filter 352 configured to perform single-ended to differential signal conversion for a transmit signal on connection 354 when a switch 353 is conductive, when a switch 387 is conductive and when a switch 323 is non-conductive. In an exemplary embodiment, the signal provided over connection 354 from the IFIC 370 may be referred to as a variable low intermediate frequency (VLIF) signal, and may be a second variable low IF signal. In an exemplary embodiment, the second variable low intermediate frequency (VLIF) signal may have a frequency on the order of approximately 150 MHz to approximately 700 MHZ (depending on bandwidth). In some embodiments, the first VLIF signal and the second VLIF signal may have the same frequency or may have different frequencies. The real signal provided by the programmable amplifier and filter 352 is provided to a polyphase filter (PPF) 351. The PPF 351 converts the real signal to a quadrature signal having in phase (I) and quadrature (Q) signals. The I and Q signals are provided to a mixer 350.

In an exemplary embodiment, the mixer 350 receives an LO2 signal over connection 348, for example from a divider 347. The divider 347 may be a fractional divider (divide by N) and develop the LO2 signal from the LO1 signal on connection 346. The mixer 350 may be a first upconversion mixer configured to upconvert a second VLIF signal from the PPF 351 to a second IF signal having a frequency of, for example, 3-5 GHz.

In an exemplary embodiment, the output of the mixer 350 is provided to a mixer 345. In an exemplary embodiment, the mixer 345 may be a second upconversion mixer configured to upconvert the second variable low IF signal from the mixer 350 to an RF frequency of, for example, 24-48 GHz according to the frequency of the LO1 signal provided over connection 346. If the mixer 345 is omitted in a direct conversion architecture, then the mixer 350 would perform the upconversion.

In an exemplary embodiment, the output of the mixer 345 is provided to a PS 344. The PS 344 applies a determined amount of phase shift and provides an output to a power amplifier (PA) 343. Although shown as a single element, the PA 343 may comprise one or more amplifier stages. The output of the PA 343 is provided to a port 342. Although shown as single elements, the PS 344, PA 343 and the port 342 may comprise multiple instances (e.g., coupled to a splitter (not shown) configured to split a signal from an output of the mixer 345 and provide it to multiple instances of the PS 344) where the port 342 may be connected to a switching system (not shown) similar to the ports 304 and 320 described above. In some embodiment, the port 342 may be connected through the switching system to the same antenna array as the ports 304 and 320.

In an exemplary embodiment, a transmit path 355 includes a programmable amplifier and filter 367 configured to perform single-ended to differential signal conversion for a transmit signal on connection 369 when a switch 368 is conductive, when a switch 392 is conductive, and when a switch 337 is non-conductive. In an exemplary embodiment, the signal provided over connection 369 from the IFIC 370 may be referred to as a second variable low intermediate frequency (VLIF) signal. In an exemplary embodiment, the second variable low intermediate frequency (VLIF) signal may have a frequency on the order of approximately 150 MHz to approximately 700 MHz (depending on bandwidth). The real signal provided by the programmable amplifier and filter 367 is provided to a polyphase filter (PPF) 366. The PPF 366 converts the real signal to a quadrature signal having in phase (I) and quadrature (Q) signals. The I and Q signals are provided to a mixer 365.

In an exemplary embodiment, the mixer 365 receives an LO2 signal over connection 364, for example from a divider 363. The divider 363 may be a fractional divider (divide by N) and develop the LO2 signal from the LO1 signal on connection 362. The mixer 365 may be a first upconversion mixer configured to upconvert the second VLIF signal from the PPF 366 to a second IF frequency of, for example, 3-5 GHZ.

In an exemplary embodiment, the output of the mixer 365 is provided to a mixer 361. In an exemplary embodiment, the mixer 361 may be a second upconversion mixer configured to upconvert the second variable low IF signal from the mixer 365 to an RF frequency of, for example, 24-48 GHz according to the frequency of the LO1 signal provided over connection 362. If the mixer 361 is omitted in a direct conversion architecture, then the mixer 365 would perform the upconversion.

In an exemplary embodiment, the output of the mixer 361 is provided to a PS 358. The PS 358 applies a determined amount of phase shift and provides an output to a power amplifier 357. Although shown as a single element, the PA 357 may comprise one or more amplifier stages. The output of the PA 357 is provided to a port 356. Although shown as single elements, the PS 358, PA 357 and the port 356 may comprise multiple instances (e.g., coupled to a splitter (not shown) configured to split a signal from an output of the mixer 361 and provide it to multiple instances of the PS 358) where the port 356 may be connected to a switching system (not shown) similar to the ports 304, 320 and 342 described above. In some embodiments, the port 356 may be connected through the switching system to the same antenna array as the ports 304, 320 and 342, and may be coupled to operate with signals that have a different (e.g., orthogonal) polarization from signals associated with the port 342. The port 356 may alternatively or additionally be coupled to an antenna that is configured to operate at a frequency different than a frequency of operation of an antenna to which the port 342 is coupled. In another exemplary embodiment, the VLIF signal from the PPF 351 and the PPF 366 may be directly converted to an RF signal by the mixer 345 and the mixer 361, in which case the mixers 350 and 365 and the dividers 347 and 363 would be omitted.

In an exemplary embodiment, the IFIC 370 may comprise a number of receive paths and a number of transmit paths. Exemplary receive paths are shown using reference numerals 371 and 372 and exemplary transmit paths are shown using reference numerals 393 and 399.

In an exemplary embodiment, the receive path 371 may include a node 373 coupled to the IF cable 305. The node 373 may be an example of a port and/or pin, or other component or interface to the cable 305. The node 373 may also be connected to a node 375. The node 375 may be connected to a switch 374. When conductive, the switch 374 may apply a receive signal from the node 375 to an input of a single-ended to differential (S2D) amplifier 376. In an exemplary embodiment, the signal at the node 375 is a single-ended real signal at a VLIF (variable low intermediate frequency) having a frequency on the order of approximately 150 MHz to approximately 700 MHz (depending on bandwidth).

The differential real signal is provided to an RF-ADC 377. The RF-ADC 377 converts the analog signal from the S2D amplifier 376 to a digital signal and provides the digital signal to a digital downconverter (DDC) 378. The DDC 378 downconverts the VLIF signal to baseband (BB) and provides the baseband signal at node 379 for further signal processing. For example, the node 379 may be coupled to the data processor 210 (e.g., to a modem).

In an exemplary embodiment, the receive path 372 may include a node 380 coupled to the IF cable 311. The node 380 may be an example of a port and/or pin, or other component or interface to the cable 311. The node 380 may also be connected to a node 381. The node 381 may be connected to a switch 382. When conductive, the switch 382 may apply a receive signal from the node 381 to an input of a single-ended to differential (S2D) amplifier 383. In an exemplary embodiment, the signal at the node 381 is a single-ended real signal at a VLIF (variable low intermediate frequency) having a frequency on the order of approximately 150 MHz to approximately 700 MHZ (depending on bandwidth).

The differential real signal is provided to an RF-ADC 384. The RF-ADC 384 converts the analog signal from the S2D amplifier 383 to a digital signal and provides the digital signal to a digital downconverter (DDC) 385. The DDC 385 downconverts the VLIF signal to baseband (BB) and provides the baseband signal at node 386 for further signal processing. For example, the node 386 may be coupled to the data processor 210 (e.g., to a modem).

In an exemplary embodiment, the RF-ADC 377 and RF-ADC 384 may operate at a frequency, ADC Fs, that is approximately four (4) times the frequency of the VLIF signal. In an exemplary embodiment, the RF-ADC and the RF-DAC (to be described below) may have an operating frequency (ADC Fs and DAC Fs) that may be on the order of 0.6 GHz to approximately 2.8 GHz in an exemplary embodiment. The frequency ADC Fs (and the frequency DAC Fs) is related to the frequency of the VLIF signal and will be described in greater detail below.

In an exemplary embodiment, a transmit path 393 may include a node 391 coupled to a digital upconverter (DUC) 390. A transmit signal may be provided by a baseband element (e.g., the data processor 210, not shown) to the node 391 for upconversion and transmission. In an exemplary embodiment, the DUC 390 upconverts a baseband signal at node 391 to a VLIF signal. The VLIF signal output from the DUC 390 is provided to an RF-DAC 389. The RF-DAC 389 converts the digital output of the DUC 390 to an analog real differential signal, which is provided to a differential to single-ended (D2S) amplifier 388. The D2S amplifier 388 converts the differential signal from the RF-DAC 389 to a single-ended signal and provides the single-ended signal to the node 375 when the switch 387 is conductive.

In an exemplary embodiment, a transmit path 399 may include a node 397 coupled to a digital upconverter (DUC) 396. A transmit signal may be provided by a baseband element (e.g., the baseband processor, not shown) to the node 397 for upconversion and transmission. In an exemplary embodiment, the DUC 396 upconverts a baseband signal at node 397 to a VLIF signal. The VLIF signal output from the DUC 396 is provided to an RF-DAC 395. The RF-DAC 395 converts the digital output of the DUC 396 to an analog differential signal, which is provided to a differential to single-ended (D2S) amplifier 394. The D2S amplifier 394 converts the differential signal from the RF-DAC to a single-ended signal and provides the single-ended signal to the node 381 when the switch 392 is conductive.

In an exemplary embodiment, the switches 323, 337, 353, 368, 374, 382, 387 and 392 may be controlled by a control signal from the data processor 210 (FIGS. 2A, 2B, 2C) or another controller.

In an exemplary embodiment, the RF-DAC 389 and the RF-DAC 395 may have an operating frequency (DAC Fs) that may be similar to the operating frequency of ADC Fs (on the order of 0.6 GHz to approximately 2.8 GHz in an exemplary embodiment) or may be another operating frequency (on the order of 1.2 GHZ to approximately 5.6 GHZ or higher). The frequency ADC Fs and the frequency DAC Fs are related to the frequency of the VLIF signal and will be described in greater detail below.

Figure 3B:
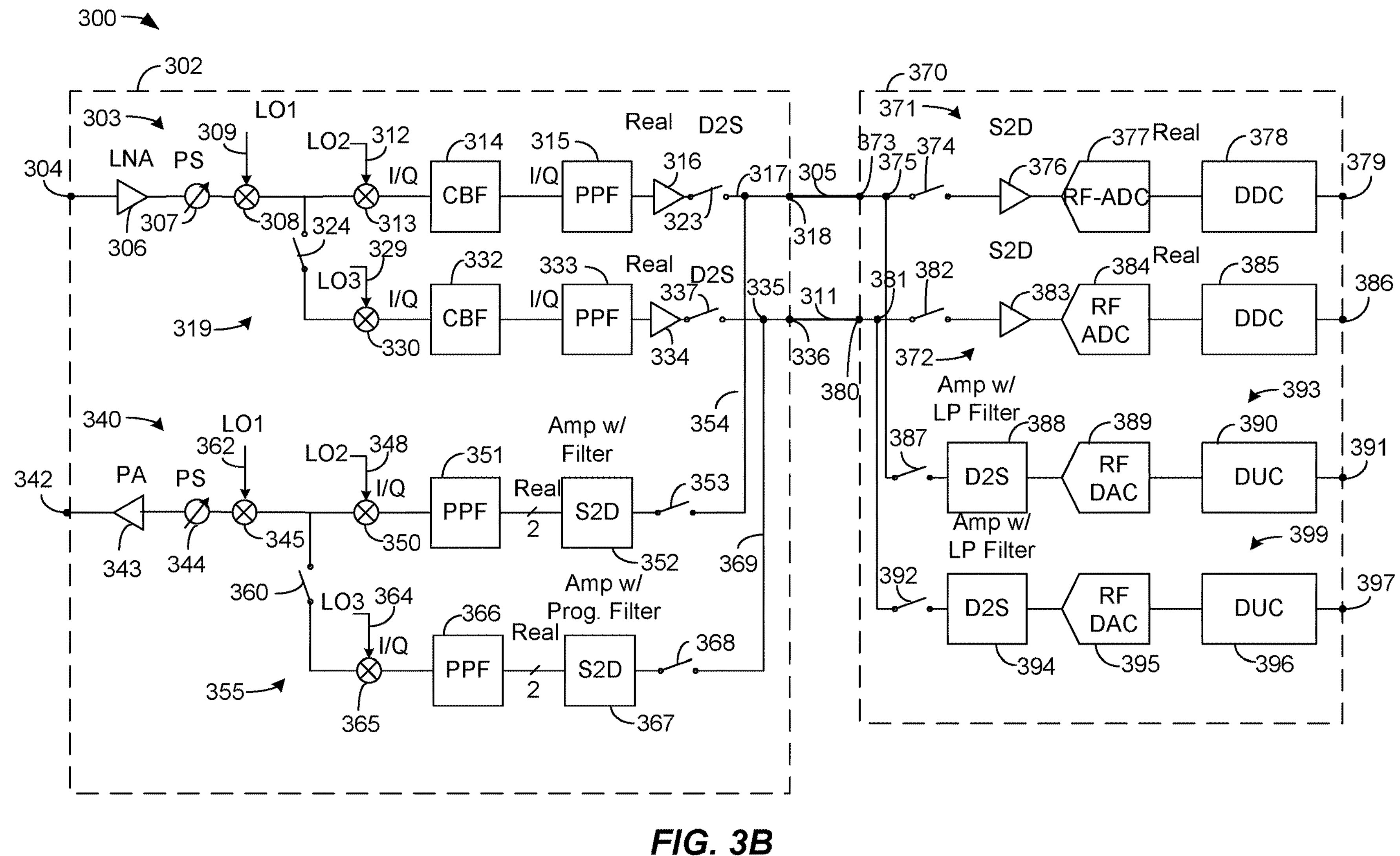
FIG. 3B is a block diagram of a millimeter wave integrated circuit (mmW-IC) and an intermediate frequency integrated circuit (IFIC) in accordance with an exemplary embodiment of the disclosure.

FIG. 3B is a block diagram of a millimeter wave integrated circuit (mmW-IC) and an intermediate frequency integrated circuit (IFIC) in accordance with an exemplary embodiment of the disclosure. The circuits in FIGS. 3A and 3B are similar and identical elements are identically labeled. In FIG. 3B, the receive paths 303 and 319 share the LNA 306, the PS 307, and the mixer 308 by the operation of the switch 324, as described above. Similarly, the transmit paths 340 and 355 share the mixer 345, the PS 344 and the PA 343 through operation of the switch 360. In an exemplary embodiment, the receive path 319 uses an LO signal (LO3) that is different than the LO signal (LO2) used by the receive path 303; and the transmit path 355 uses an LO signal (LO3) that is different than the LO signal (LO2) used by the transmit path 340. In some exemplary embodiments, the use of LO2 and LO3 allows the use of a different VLIF center frequency for receive signals and transmit signals to optimize signal path performance.

Figure 4:
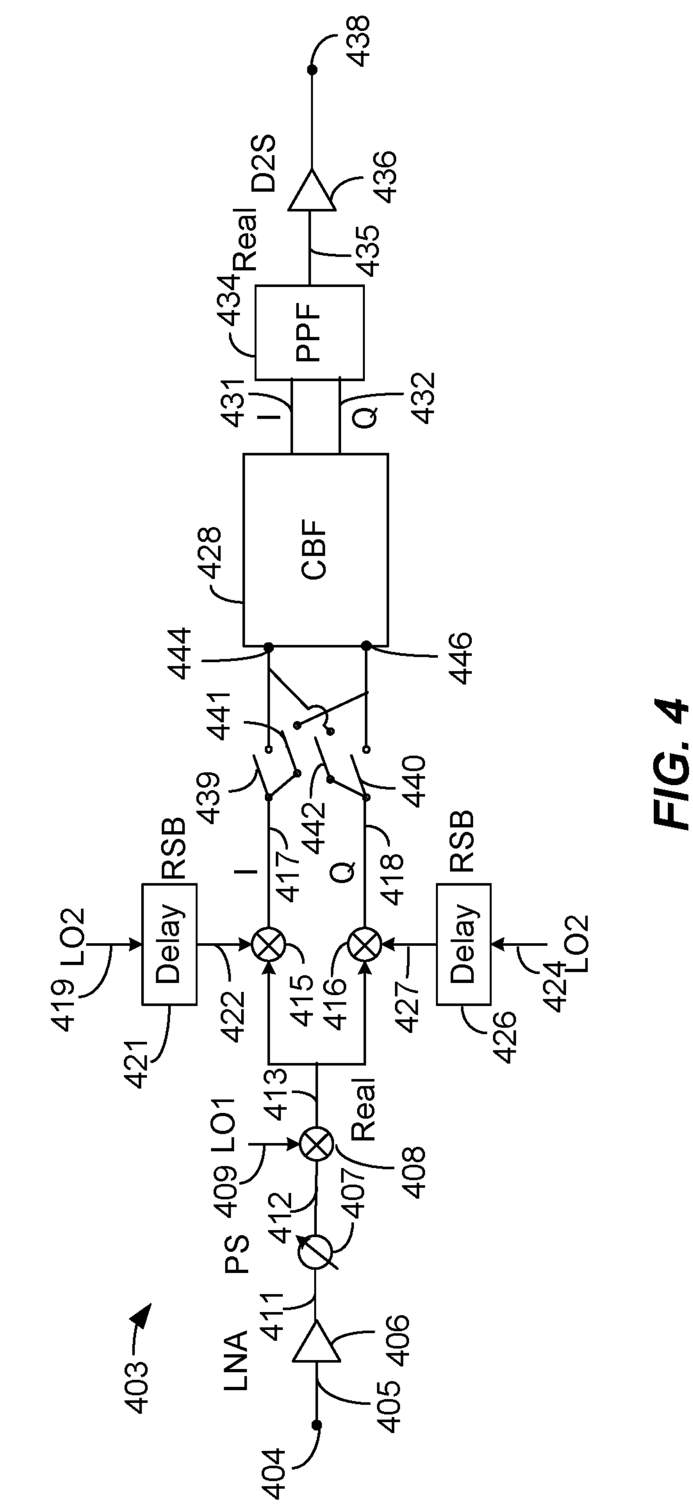
FIG. 4 is a diagram showing an exemplary embodiment of a receive path of FIG. 3A or 3B.

FIG. 4 is a diagram showing an exemplary embodiment of a receive path. In an exemplary embodiment, the receive path 403 may be an exemplary embodiment of the receive path 303 or the receive path 319 of FIG. 3A and FIG. 3B.

In an exemplary embodiment, the receive path 403 may include a port 404 that may be coupled to an antenna, or may be coupled through a switching system to one or more antennas. In an exemplary embodiment, the port 404 is coupled to a low noise amplifier (LNA) 406. The LNA 406 is coupled to a phase shifter (PS) 407. Although shown as a single element, the LNA 406 may comprise one or more amplifier stages.

The PS 407 may be coupled to a mixer 408. In an exemplary embodiment, the mixer 408 may comprise a first downconverter, or a first downconverter stage and may be configured to downconvert a radio frequency signal provided by the PS 407 to a lower frequency. In an exemplary embodiment, the RF input signal to the mixer 408 may be at a millimeter wave (mmW) frequency of, for example, 24-48 gigahertz (GHz). In an exemplary embodiment, the mixer 408 may be configured to receive a local oscillator (LO) signal (LO1) over connection 409 from a frequency synthesizer (such as the RX LO signal generator 280 or 279 of FIG. 2B). In an exemplary embodiment, the mixer 408 may be configured to convert the mmW RF signal from the PS 407 to a frequency in the range of, for example, 3-5 GHZ. In an exemplary embodiment, the LO1 signal on connection 409 may be an integer LO signal and the mixer 408 may perform integer downconversion. The output of the mixer 408 is a differential real signal.

In an exemplary embodiment, the differential real signal from the mixer 408 is provided to quadrature mixers 415 and 416. In an exemplary embodiment, the mixer 415 may be configured to generate an in phase (I) signal and the mixer 416 may be configured to generate a quadrature (Q) signal, by using an I LO2 signal at connection 419 and a Q LO2 signal at connection 424.

In an exemplary embodiment, the mixers 415 and 416 may comprise a second downconverter, or a second downconverter stage and may be configured to downconvert the first IF signal provided by the mixer 408 to a first variable low intermediate frequency (VLIF).

In an exemplary embodiment, the LO1 signal may be divided by a non-integer (divide by N) function to produce the LO2 signal as described above. For example, the divider 310 (or 328) in FIG. 3A may provide the divided LO2 signals and may also generate the I and Q LO phase shifted signals on connections 419 and 424, respectively. The divided I LO2 signal on connection 419 may be provided to a delay element 421 and the divided Q LO2 signal on connection 424 may be provided to a delay element 426. In an exemplary embodiment, the delay element 421 (and the delay element 426) may provide a variable and selectable phase delay to the LO2 signal to help correct for phase imbalance between the I signal in the mixer 415 and the Q signal in the mixer 416. The output of the delay element 421 on connection 422 is provided as the corrected LO2 signal to the I mixer 415.

Similarly, the divided Q LO2 signal on connection 424 may be provided to a delay element 426. In an exemplary embodiment, the delay element 426 may provide a variable and selectable phase delay to the LO2 signal to help correct for phase imbalance between the I signal in the mixer 415 and the Q signal in the mixer 416. The output of the delay element 426 is provided over connection 427 as the corrected LO2 signal to the Q mixer 416.

The LO2 signal may be used by the mixer 415 and the Q mixer 416 to downconvert the 3-5 GHz first IF signal from the mixer 408 to a first variable intermediate frequency (IF) signal, referred to herein as a variable low intermediate frequency (VLIF) signal. In another implementation, it is also possible that there is only one downconversion for each of these signals such that mixer 408 may be omitted.

The I output of the I mixer 415 and the Q output of the Q mixer 416 are provided to a complex bandpass filter (CBF) 428 through switches 439, 440, 441 and 442. For example, if switches 439 and 440 are conductive and switches 441 and 442 are nonconductive, the I output of the I mixer 415 may be provided to a node 444 of the CBF 428 and the Q output of the Q mixer 416 may be provided to a node 446 of the CBF 428 However, in an exemplary embodiment, the I and Q signals provided to the CBF 428 may be flipped to minimize signal aliasing as will be described below in FIGS. 8A and 8B. For example, if switches 439 and 440 are nonconductive and switches 441 and 442 are conductive, the I output of the I mixer 415 may be provided to the node 446 of the CBF 428 and the Q output of the Q mixer 416 may be provided to the node 444 of the CBF 428. Switching the output of the I mixer 415 and the Q output of the Q mixer 416 may minimize signal aliasing as will be described below in FIGS. 8A and 8B. The CBF 428 filters the channel selected by the LO2 frequency and provides I and Q signals over respective connections 431 and 432 to polyphase filter (PPF) 434. The PFF 434 converts the I and Q signals from the CBF 428 to a real signal. The real signal on connection 435 is provided to an amplifier 436 that performs differential to single-ended (D2S) conversion. The single ended signal is provided to the node 438 and to an IF cable such as the IF cable 305 (FIG. 3A/3B). Elements 404, 406, 407, 408, 415 and 416, 428, 434, 436, and 438 may be examples of elements 304, 306, 307, 308, 313, 314, 315, 316, and 317 (FIG. 3A, 3B), respectively.

FIG. 5 is a drawing of a table 500 showing relationships between and among signal bandwidth and variable low intermediate frequency. For example, for a signal bandwidth of 100 MHz, the intermediate frequency (Fif) is 150 MHZ, the minimum bandwidth frequency (Fmin) is 100 MHz, the maximum bandwidth frequency (Fmax) is 200 MHz, the ADC operating frequency (ADC Fs) is 0.6 GHZ and the DAC operating frequency (DAC Fs) is 1.2 GHz. In an exemplary embodiment, the ADC operating frequency (ADC Fs) is four (4) times the intermediate frequency Fif, and the DAC operating frequency (DAC Fs) is eight (8) times the intermediate frequency Fif. In this example, the Fif is 150 MHz so the ADC Fs (for the RF-ADC of FIGS. 3A and 3B) is 0.6 GHZ (600 MHZ); and the DAC Fs (for the RF-DAC of FIGS. 3A and 3B) is 1.2 GHZ (1200 MHZ). However, the values shown in this example for the ADC operating frequency (ADC Fs) and the DAC operating frequency (DAC Fs) may differ from that shown. For example, in some embodiments, the ADC operating frequency (ADC Fs) and the DAC operating frequency (DAC Fs) may be the same, or the ADC operating frequency (ADC Fs) may be higher than the DAC operating frequency (DAC Fs). Further, the ADC operating frequency (ADC Fs) and the DAC operating frequency (DAC Fs) may be higher or lower than that shown in the example of FIG. 5 and may be different multiples of the intermediate frequency Fif than that shown in FIG. 5.

Similarly, for a signal bandwidth of 200 MHZ, the intermediate frequency (Fif) is 250 MHz, the minimum bandwidth frequency (Fmin) is 150 MHZ, the maximum bandwidth frequency (Fmax) is 350 MHZ, the ADC operating frequency (ADC Fs) is 1.0 GHZ, and the DAC operating frequency (DAC Fs) is 2.0 GHZ.

For a signal bandwidth of 400 MHZ, the intermediate frequency (Fif) is 400 MHz, the minimum bandwidth frequency (Fmin) is 200 MHZ, the maximum bandwidth frequency (Fmax) is 600 MHZ, the ADC operating frequency (ADC Fs) is 1.6 GHZ, and the DAC operating frequency (DAC Fs) is 3.2 GHZ; for a signal bandwidth of 600 MHZ, the intermediate frequency (Fif) is 500 MHZ, the minimum bandwidth frequency (Fmin) is 200 MHz, the maximum bandwidth frequency (Fmax) is 800 MHZ, the ADC operating frequency (ADC Fs) is 2.0 GHZ, and the DAC operating frequency (DAC Fs) is 4.0 GHz; and for a signal bandwidth of 800 MHZ, the intermediate frequency (Fif) is 700 MHZ, the minimum bandwidth frequency (Fmin) is 300 MHZ, the maximum bandwidth frequency (Fmax) is 1100 MHZ, the ADC operating frequency (ADC Fs) is 2.8 GHz, and the DAC operating frequency (DAC Fs) is 5.6 GHZ. The selectable Fif that ranges from approximately 150 MHz to approximately 700 MHZ in this example gives rise to the concept of a variable low intermediate frequency (VLIF) and allows the RF-ADC (377/384) and the RF-DAC (389/395) in the IFIC 370 to efficiently process the receive signals from the mmW-IC 302 and to process transmit signals for the mmW-IC 302.

Figure 6:
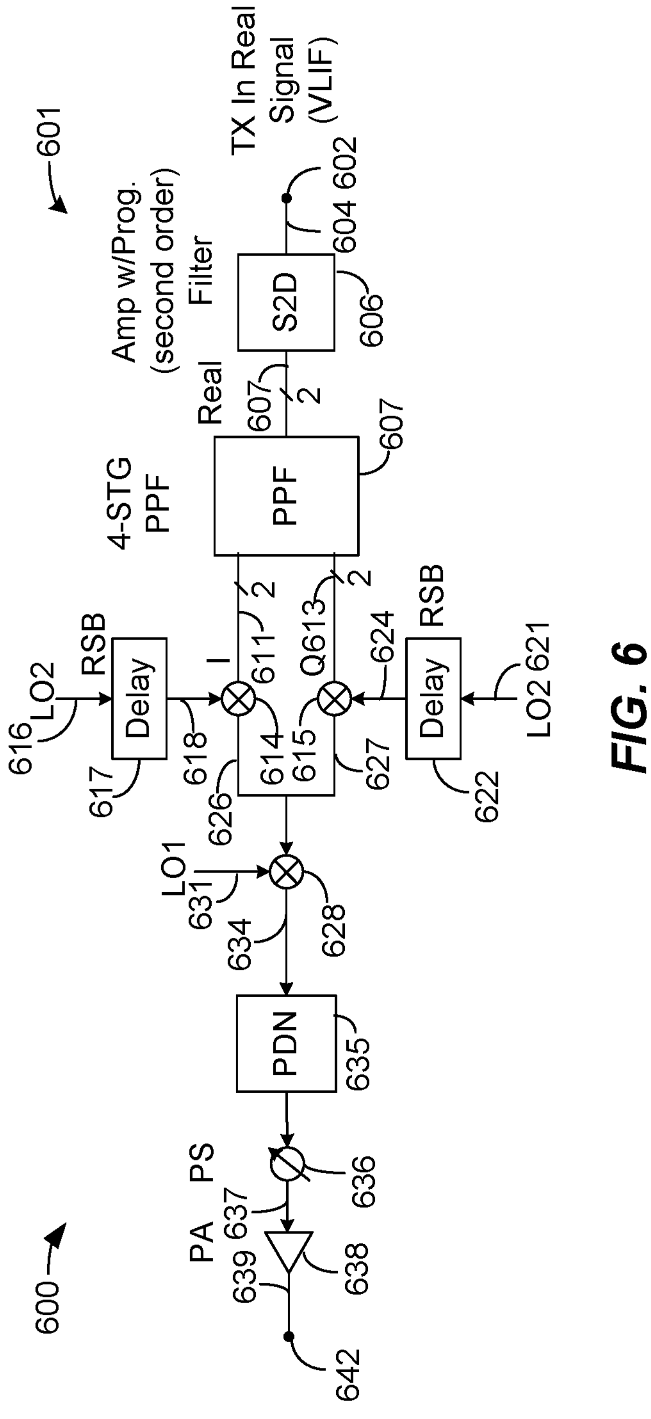
FIG. 6 is a diagram showing an exemplary embodiment of a transmit path of FIG. 3A or 3B.

FIG. 6 is a diagram showing an exemplary embodiment of a transmit path. In an exemplary embodiment, a transmit path 601 may be an example of the transmit path 340 or the transmit path 355 of FIG. 3A or 3B.

In an exemplary embodiment, a transmit path 601 includes a node 602 configured to provide a transmit signal at a second variable low IF to a programmable amplifier and filter 606 over connection 604. In an exemplary embodiment, the transmit signal on connection 604 is at a VLIF as described herein. In an exemplary embodiment, the programmable amplifier and filter 606 may be configured to perform single-ended to differential (S2D) signal conversion for a transmit signal on connection 604. The real differential signal provided by the programmable amplifier and filter 606 is provided to a polyphase filter (PPF) 608 over connection 607. In an exemplary embodiment, the PPF 608 may be a 4-stage PPF. The PPF 608 converts the real differential signal to a complex (quadrature) signal having in phase (I) and quadrature (Q) signals. The I signal is provided over connection 611 to an I mixer 614 and the Q signal is provided over connection 613 to a Q mixer 615.

In an exemplary embodiment, a fractionally divided (divide by N) LO2 signal is provided over connection 616 to a delay element 617. In an exemplary embodiment, the delay element 617 (and the delay element 622) may provide a variable and selectable phase delay to the LO2 signal to help correct for phase imbalance between the I signal in the mixer 614 and the Q signal in the mixer 615. The output of the delay element 617 on connection 618 is provided as the corrected LO2 signal to the I mixer 614.

Similarly, a fractionally divided (divide by N) LO2 signal is provided over connection 621 to a delay element 622. In an exemplary embodiment, the delay element 622 may provide a variable and selectable phase delay to the LO2 signal to help correct for phase imbalance between the I signal in the mixer 614 and the Q signal in the mixer 615. The output of the delay element 622 on connection 624 is provided as the corrected LO2 signal to the Q mixer 615.

The I mixer 614 and the Q mixer 615 may be a first upconversion mixer configured to upconvert the second variable low IF signal from the PPF 608 to a second IF frequency of, for example, 3-5 GHz. The output of the I mixer 614 on connection 626 and an output of the Q mixer 615 on connection 627 is provided to a mixer 628.

In an exemplary embodiment, the mixer 628 may be a second upconversion mixer configured to upconvert the second IF signal from the I mixer 614 and the Q mixer 615 to an RF frequency of, for example, 24-48 GHz according to the frequency of the LO1 signal provided over connection 631.

In an exemplary embodiment, the output of the mixer 628 on connection 634 is provided to a power distribution network (PDN) 635 and an output of the PDN 635 is provided to a PS 636. The PS 636 applies a determined amount of phase shift and provides an output to a power amplifier (PA) 638 over connection 637. Although shown as a single element, the PA 638 may comprise one or more amplifier stages. The output of the PA 638 on connection 639 is provided to a port 642. The port 642 may be coupled to an antenna, or coupled through a switching system to one or more antennas. Elements 602, 606, 607, 614 and 615, 628, 635, 636, 638, and 642 may be examples of elements 317, 352, 351, 350, 345, 360, 344, 343, and 342 (FIG. 3A, 3B), respectively.

Figure 7:
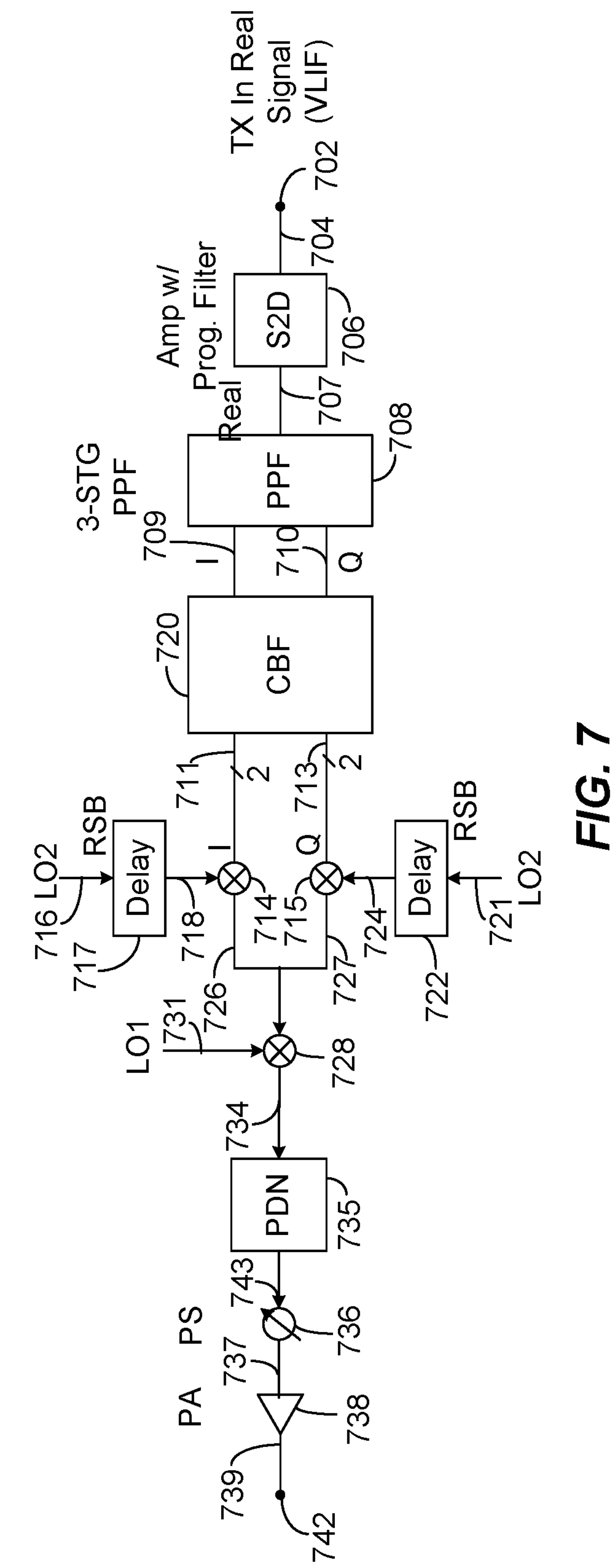
FIG. 7 is a diagram showing an exemplary embodiment of a transmit path of FIG. 3A or 3B.

FIG. 7 is a diagram showing an exemplary embodiment of a transmit path. In an exemplary embodiment, a transmit path 701 may be an example of the transmit path 340 or the transmit path 355 of FIG. 3A or 3B.

In an exemplary embodiment, a transmit path 701 includes a node 702 configured to provide a transmit signal to a programmable amplifier and filter 706 over connection 704. In an exemplary embodiment, the transmit signal on connection 704 is at a VLIF as described herein. In an exemplary embodiment, the programmable amplifier and filter 706 may be configured to perform single-ended to differential (S2D) signal conversion for a transmit signal on connection 704. The real differential signal provided by the programmable amplifier and filter 706 is provided to a polyphase filter (PPF) 708 over connection 707. In an exemplary embodiment, the PPF 708 may be a 3-stage PPF. The PPF 708 converts the real differential signal to a complex (quadrature) signal having in phase (I) and quadrature (Q) signals. The I signal is provided over connection 709 and the Q signal is provided over connection 710 to a complex bandpass filter (CBF) 720. In an exemplary embodiment, the CBF 720 in FIG. 7 provides rejection of the image frequency and in some embodiments can reduce the number of stages of the PPF 708. In some embodiments, the PPF may be 1 stage, 2 stage, or other numbers of stages. The CBF 720 selects the desired frequency band and provides an I signal over connection 711 to an I mixer 714 and a Q signal over connection 713 to a Q mixer 715.

In an exemplary embodiment, the CBF 720 helps to filter the negative image frequencies of the real signal on connections 709 and 710 for better single side band upconversion. When using an exemplary 4-stage PPF (as shown in FIG. 6), the negative image of the input TX signal from the DAC (389/395, FIG. 3A) is attenuated before upconversion using the LO1 and the LO2 signals through the mixers 714, 715 and 728. As an alternative embodiment, a 2nd or $3^{rd}$ order complex BPF (CBF) can be added in addition to a 2-stage or a 3-stage PPF to achieve similar image rejection at the TX output. In general, an M-stage PPF can be cascaded with an Nth order CBF to achieve the desired image rejection at the TX output.

In an exemplary embodiment, a fractionally divided (divide by N) LO2 signal is provided over connection 716 to a delay element 717. In an exemplary embodiment, the delay element 717 (and the delay element 722) may provide a variable and selectable phase delay to the LO2 signal to help correct for phase imbalance between the I signal in the mixer 714 and the Q signal in the mixer 715. The output of the delay element 717 on connection 718 is provided as the corrected LO2 signal to the I mixer 714.

Similarly, a fractionally divided (divide by N) LO2 signal is provided over connection 721 to a delay element 722. In an exemplary embodiment, the delay element 722 may provide a variable and selectable phase delay to the LO2 signal to help correct for phase imbalance between the I signal in the mixer 714 and the Q signal in the mixer 715. The output of the delay element 722 on connection 724 is provided as the corrected LO2 signal to the Q mixer 715.

The I mixer 714 and the Q mixer 715 may be a first upconversion mixer configured to upconvert the second VLIF signal from the CBF 720 to a second IF of, for example, 3-5 GHz.

The output of the I mixer 714 on connection 726 and an output of the Q mixer 715 on connection 727 is provided to a mixer 728.

In an exemplary embodiment, the mixer 728 may be a second upconversion mixer configured to upconvert the second IF signal from the I mixer 715 and the Q mixer 715 to an RF frequency of, for example, 24-48 GHz according to the frequency of the LO1 signal provided over connection 731. In an exemplary embodiment, an output of the mixer 728 is provided over connection 734 to a power distribution network (PDN) 735.

In an exemplary embodiment, the output of the PDN 735 on connection 743 is provided to a PS 736. The PS 736 applies a determined amount of phase shift and provides an output to a power amplifier (PA) 738 over connection 737. Although shown as a single element, the PA 738 may comprise one or more amplifier stages. The output of the PA 738 on connection 739 is provided to a port 742. The port 742 may be coupled to an antenna, or may be coupled through a switching system to one or more antennas. Elements 702, 706, 708, 714 and 715, 728, 735, 736, 738, and 742 may be examples of elements 317, 352, 351, 350, 345, 360, 344, 343, and 342 (FIG. 3A, 3B), respectively.

Figure 8A:
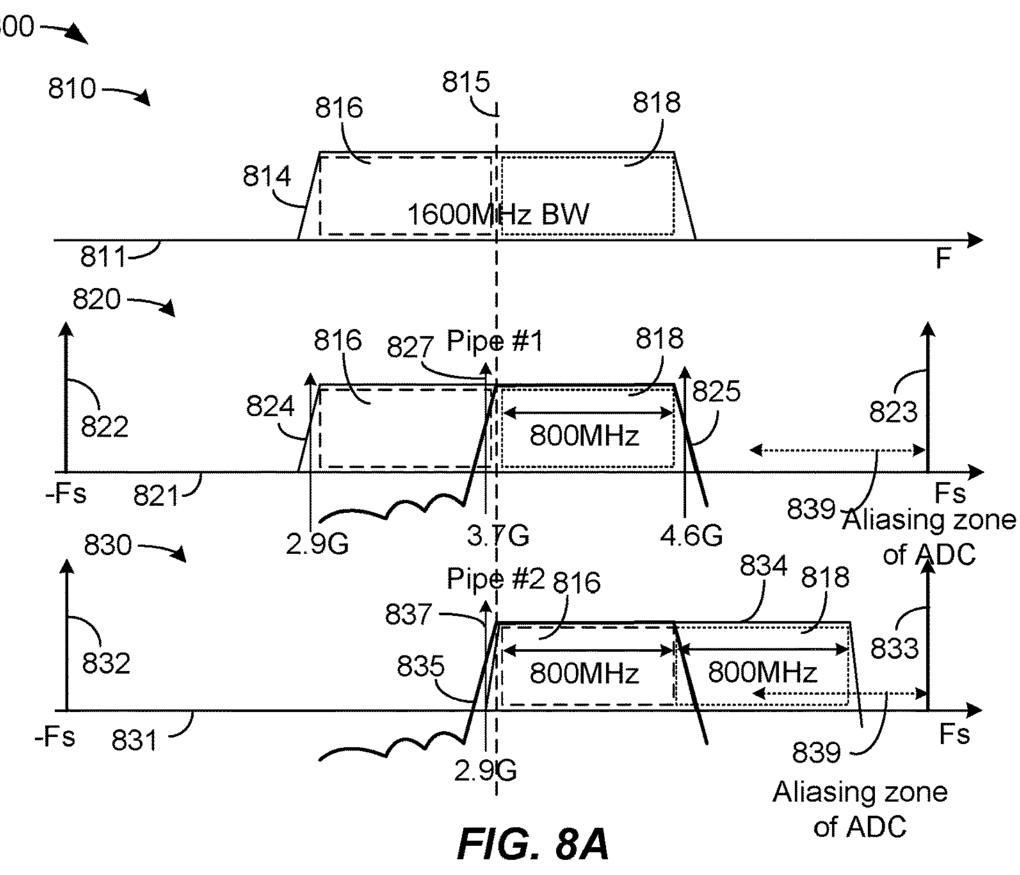
FIGS. 8A and 8B are diagrams showing signal anti-aliasing in accordance with an exemplary embodiment of the disclosure.
Figure 8B:
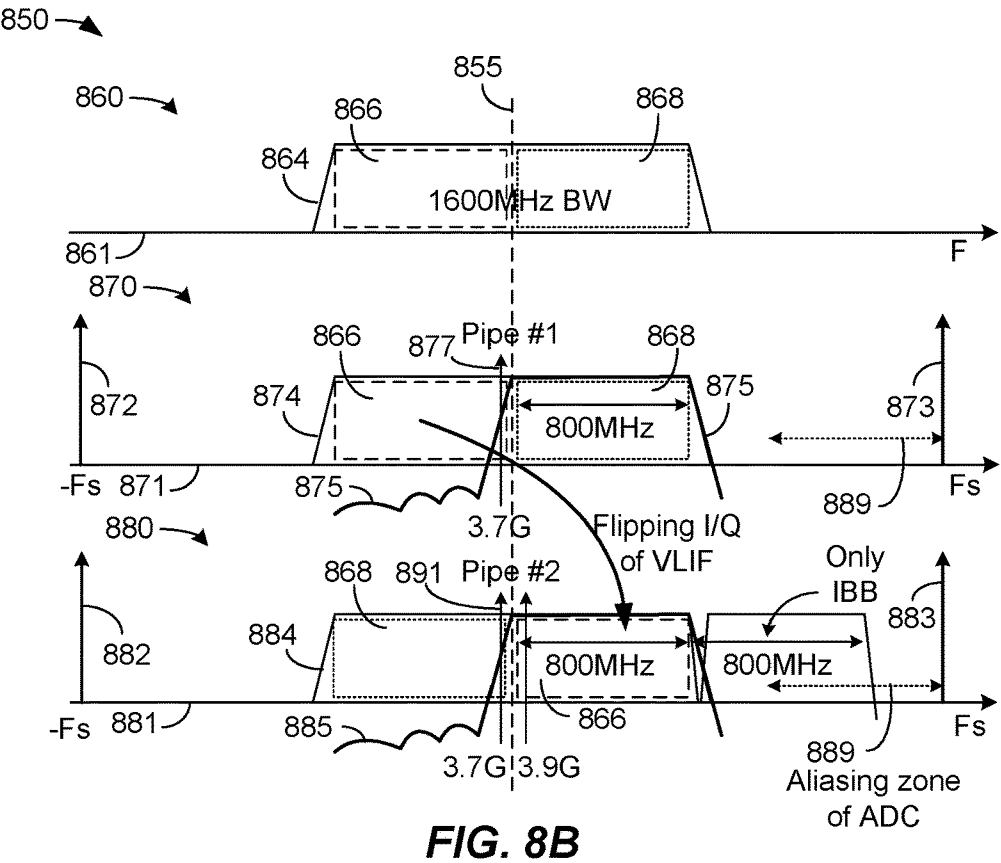

FIGS. 8A and 8B are diagrams showing signal anti-aliasing. FIG. 8A includes a graph 810 having a horizontal axis showing frequency increasing to the right. An exemplary signal band 814 is shown as having a bandwidth of 1600 MHZ in this example. The signal band 814 may include a band center 815, a first channel 816 and a second channel 818. The first channel 816 can be processed by the mixer 308, divider 310, mixer 313, CBF 314, PPF 315 and amplifier 316 of FIG. 3A or 3B and the second channel 818 may be processed by, for example, the mixer 326, divider 328, mixer 330, CBF 332, PPF 333 and amplifier 334 of FIG. 3A or 3B. The processing of signals 816 and 818 is described further in the graphs 820 and 830 as described below.

The graph 820 has a horizontal axis showing frequency increasing to the right, a band center 815, a lower frequency, -Fs 822 and an upper frequency, Fs 823. The frequency Fs refers to the ADC sampling frequency for a signal in the communication channel 818. An aliasing zone 839 is shown for reference. The graph 820 illustrates a receive signal being processed by the mixer 308, divider 310, mixer 313, CBF 314, PPF 315 and amplifier 316 of FIG. 3A or 3B (or the mixer 326, divider 328, mixer 330, CBF 332, PPF 333 and amplifier 334 of FIG. 3A or 3B), referred to as pipe #1.The graph 820 shows an exemplary signal band 824 having a bandwidth of 1600 MHZ in this example. The signal band 824 may include a band center 815, the first channel 816 and the second channel 818. An LO signal 827 is shown as being offset from the band center 815, and a complex filter response 825 is also shown. The complex filter response 825 shows that for the receive path 303 (pipe #1) the second channel 818 remains within the filter response 825. In an exemplary embodiment, the signal band 824 could span from approximately 3 GHz to approximately 4.6 GHz. The LO signal 827 could be at approximately 3.7 GHZ, which would make the signal in the channel 818 fall between approximately 100 MHz and approximately 900 MHz before the RF-ADC 377 (FIG. 3A or 3B). The signal in the channel 816 would fall between approximately −700 MHz and approximately 100 MHz and would be rejected by the residual sideband (RSB) of the PPF 315 and the CBF 314 (FIG. 3A or 3B). In one exemplary embodiment, the Fs of the RF-ADC 377 could be approximately 2 GHZ. This will make the aliasing zone 839 of the RF-ADC 377 fall between approximately 1.1 GHZ and approximately 2 GHZ. Any signal falling between these frequencies will degrade the SNR of the main signal being digitized, which would be a signal in the communication channel 818 in this example. Further, there will be no signal between the Fs and Fs-900 MHz, which is the aliasing zone 839 of the RF-ADC 377 in this example.

The graph 830 has a horizontal axis showing frequency increasing to the right, a band center 815, a lower frequency, −Fs 832 and an upper frequency, Fs 833. The graph 830 illustrates a receive signal being processed by the other of the receive paths 303 or 319, referred to as pipe #2. The graph 830 shows an exemplary signal band 834 having a bandwidth of 1600 MHz in this example; however, the signal band 834 is shifted in frequency relative to the signal band 824. In an exemplary embodiment, the LO for the signal in the channel 816 is located at 2.9 GHZ. The signal band 834 may include the first channel 816 and the second channel 818. An LO signal 837 is shown as being offset from the band center 815, and a complex filter response 835 is also shown. In this example, with an RF-ADC sampling frequency Fs of 2 GHZ, the aliasing zone 839 occurs from approximately 1.1 GHz to approximately 2 GHz. The signal in the channel 818 now appears at approximately 900 MHz to approximately 1700 MHZ, which falls within the aliasing zone 839 of the RF-ADC 377 (FIG. 3B). This will degrade the signal-to-noise ratio (SNR) of the signal in the channel 816 when digitized by the RF-ADC 377. The complex filter response 835 shows that for the receive path 319 (pipe #2) that the first channel 816 remains within the filter response 835, but the channel 818 falls into the aliasing zone 839. If this signal is not filtered by the filtering response 835, this will degrade the SNR of a signal in the channel 816 at the output of the RF-ADC 377.

FIG. 8B includes a graph 860 having a horizontal axis showing frequency increasing to the right. An exemplary signal band 864 is shown as having a bandwidth of 1600 MHz in this example. The signal band 864 may include a band center 855, a first channel 866 and a second channel 868. The first channel 866 can be processed by the mixer 308, divider 310, mixer 313, CBF 314, PPF 315 and amplifier 316 of FIG. 3A or 3B and the second channel 868 may be processed by, for example, the mixer 326, divider 328, mixer 330, CBF 332, PPF 333 and amplifier 334 of FIG. 3A or 3B, as described above.

The graph 870 has a horizontal axis showing frequency increasing to the right, a band center 855, a lower frequency, −Fs 872 and an upper frequency, Fs 873. The graph 870 illustrates a receive signal being processed by one of the receive paths 303 or 319, referred to as pipe #1. The graph 870 shows an exemplary signal band 874 having a bandwidth of 1600 MHz in this example. The signal band 874 may include a band center 855, the first channel 866 and the second channel 868. An LO signal 877 is shown as being offset from the band center 855, and a complex filter response 875 is also shown. In the exemplary embodiment where the signal band 874 lies between approximately 3 GHz and approximately 4.6 GHz before the second downconversion, the frequency of the LO signal 877 would be 3.7 GHZ for example. After downconversion, the signal in the channel 868 falls between 100 MHz and 900 MHZ, and the signal in the channel 866 falls between −700 MHz and +100 MHz. The complex filter response 875 shows that for the receive path 303 (pipe #1) that the second channel 868 remains within the filter response 875. The signal in the channel 866 is rejected by the RSB of the signal path.

The graph 880 has a horizontal axis showing frequency increasing to the right, a band center 855, a lower frequency, −Fs 882 and an upper frequency, Fs 883. The graph 880 illustrates a receive signal being processed by the other of the receive paths 303 or 319, referred to as pipe #2. The graph 880 shows an exemplary signal band 884 having a bandwidth of 1600 MHz in this example. The signal band 884 may include a first channel 888 and a second channel 886. An LO signal 891 is shown as being offset from the band center 855, and a complex filter response 885 is also shown.

However, in an exemplary embodiment, the I and Q signals in the receive path 303 or 319 (for example) are flipped as described above with respect to FIG. 4 so that the first channel 866 and the second channel 868 are flipped and appear on opposite sides of the IF signal 891 compared to the graph 830. Additionally, the IFLO frequency 891 for the second downconversion would be at 3.9 GHZ in an exemplary embodiment. In this manner, the second channel 868 does not fall in the aliasing zone 889 (1.1 GHz to 2 GHz in the exemplary embodiment above), but instead is rejected by the RSB of the signal path 319 in this example.

Figure 9:
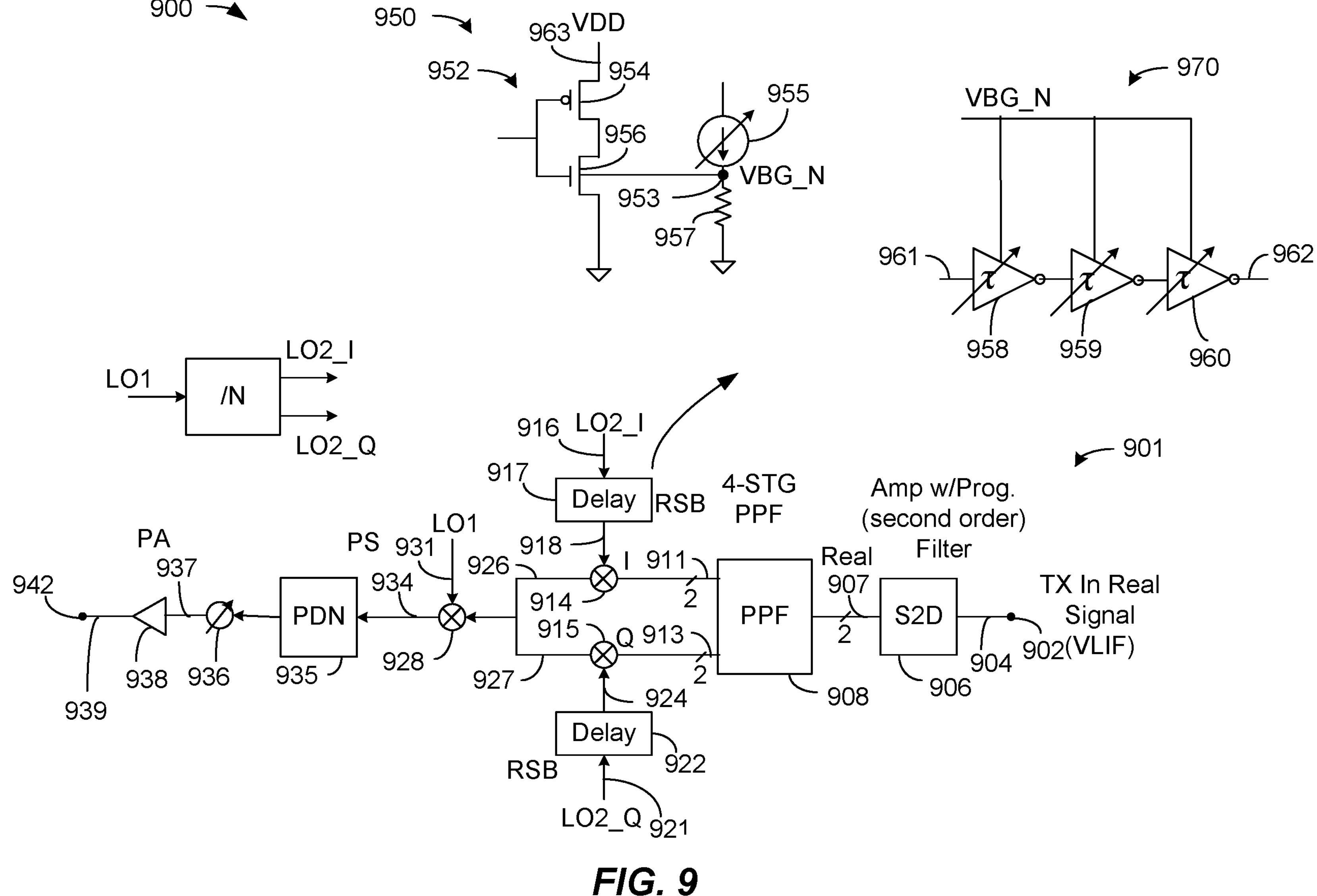
FIG. 9 is a diagram illustrating the LO2 signal phase delay of FIG. 4, FIG. 6 and FIG. 7 in greater detail.

FIG. 9 is a diagram 900 illustrating a transmit path 901 showing the LO2 signal phase delay of FIG. 4, FIG. 6 and FIG. 7 in greater detail. The description of the transmit path 901 of FIG. 9 will be similar to the description of the transmit path 601 of FIG. 6. Accordingly, elements in FIG. 9 labeled 9XX are similar to corresponding elements in FIG. 6 labeled 6XX.

In an exemplary embodiment, a transmit path 901 includes a node 902 configured to provide a baseband transmit signal to a programmable amplifier and filter 906 over connection 904. In an exemplary embodiment, the transmit signal on connection 904 is at a VLIF as described herein. In an exemplary embodiment, the programmable amplifier and filter 906 may be configured to perform single-ended to differential (S2D) signal conversion for a transmit signal on connection 904. The real differential signal provided by the programmable amplifier and filter 906 is provided to a polyphase filter (PPF) 908 over connection 907. In an exemplary embodiment, the PPF 908 may be a 4-stage PPF. The PPF 908 converts the real differential signal to a complex (quadrature) signal having in phase (I) and quadrature (Q) signals. The I signal is provided over connection 911 to an I mixer 914 and the Q signal is provided over connection 913 to a Q mixer 915.

In an exemplary embodiment, a fractionally divided (divide by N) LO2 signal is provided over connection 916 to a delay element 917. In an exemplary embodiment, the delay element 917 (and the delay element 922) may provide a variable and selectable phase delay to the LO2 signal to help correct for phase imbalance between the I signal in the mixer 914 and the Q signal in the mixer 915. The output of the delay element 917 on connection 918 is provided as the corrected LO2 signal to the I mixer 914.

Similarly, a fractionally divided (divide by N) LO2 signal is provided over connection 921 to a delay element 922. In an exemplary embodiment, the delay element 922 may provide a variable and selectable phase delay to the LO2 signal to help correct for phase imbalance between the I signal in the mixer 914 and the Q signal in the mixer 915. The output of the delay element 922 on connection 924 is provided as the corrected LO2 signal to the Q mixer 915.

In an exemplary embodiment, a delay circuit 950 may be used to implement the delay elements 917 and 922 described herein. The delay circuit 950 may include an inverter circuit 952 having transistors 954 and 956 connected between a system voltage, VDD, and a system reference potential. A current source 955 may be connected to a node 953. The node 953 may also be connected to what is referred to as a back gate of the transistor 956. A resistor 957 is also connected between the node 953 and a reference potential. The current from the current source 955 drops across the resistor 957 and creates a voltage VBG_N at node 953. The transistors 954 and 956 are a part of any and each of the inverters 958, 959 and 960 in the circuit 970.

A back gate voltage, VBG_N, may be provided to the chain of inverters 958, 959 and 960 in this example, as shown in the circuit 970. Other numbers of inverters may be implemented. An input to the first inverter 958 on connection 961 may correspond to the LO2 signal on connection 916 and connection 921. The inverters 958, 959 and 960 selectively delay the signal on connection 961 so that a delayed signal appears at connection 962. The inverters 958, 959 and 960 may be controlled by a control signal from the data processor 210 of FIG. 2B for example, or another controller. For example, a signal from the data processor 210 may adjust the current source 955, which adjusts the back gate voltage, VBG_N, which can control the amount of delay provided by the circuit 970. The connection 962 corresponds to the signal on connection 918 and connection 924. In an exemplary embodiment, the I mixer 914 and the Q mixer 915 will receive inversely delayed signals to maximize the total amount of phase shift.

The I mixer 914 and the Q mixer 915 may be a first upconversion mixer configured to upconvert the VLIF signal from the PPF 908 to a second IF frequency of, for example, 3-5 GHz. The output of the I mixer 914 on connection 926 and an output of the Q mixer 915 on connection 927 is provided to a mixer 928.

In an exemplary embodiment, the mixer 928 may be a second upconversion mixer configured to upconvert the second IF signal from the I mixer 914 and the Q mixer 915 to an RF frequency of, for example, 24-48 GHz according to the frequency of the LO1 signal provided over connection 931.

In an exemplary embodiment, the output of the mixer 928 on connection 934 is provided to a PDN network 935, and then to PS 936. The PS 936 applies a determined amount of phase shift and provides an output to a power amplifier (PA) 938 over connection 937. Although shown as a single element, the PA 938 may comprise one or more amplifier stages. The output of the PA 938 on connection 939 is provided to a port 942. The port 942 may be coupled to an antenna, or may be coupled through a switching system to one or more antennas as described above with respect to ports 342 and 356.

Figure 10:
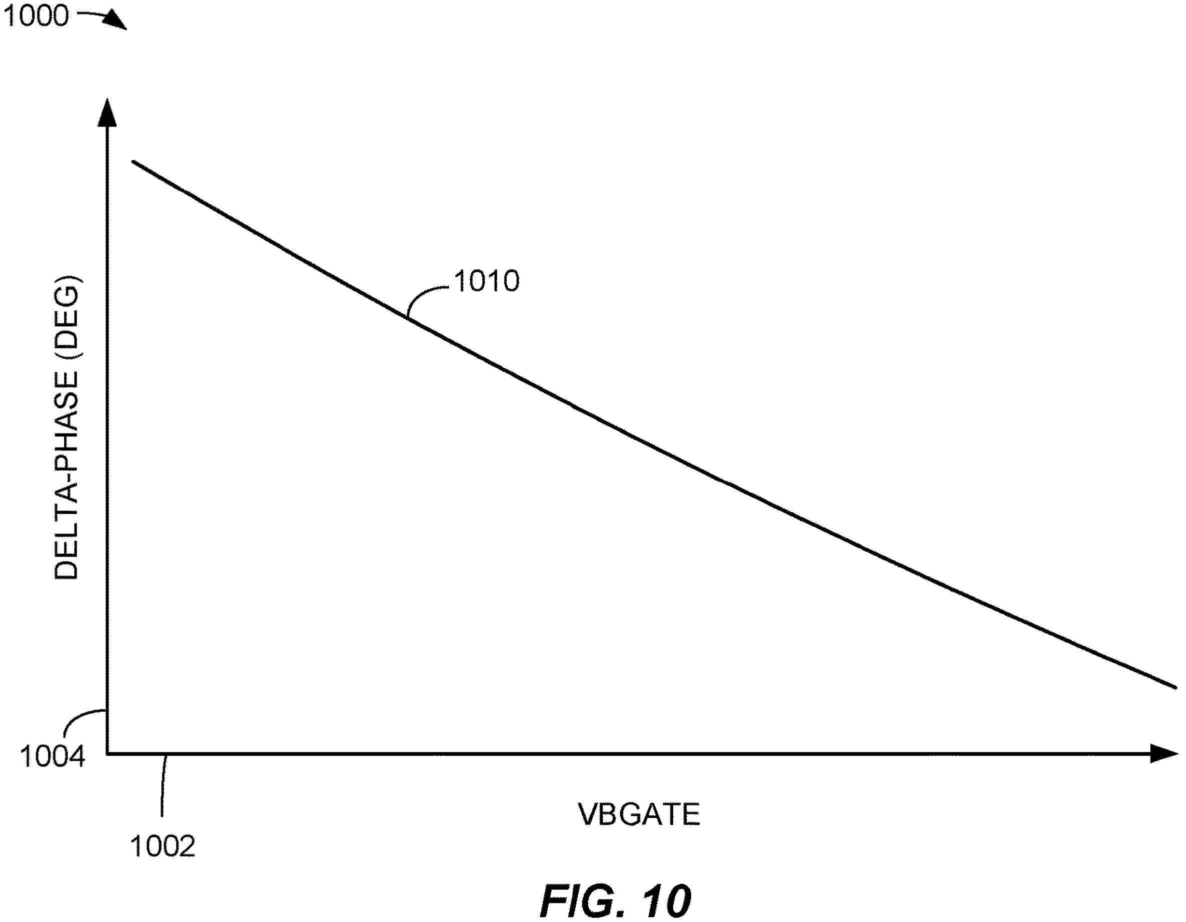
FIG. 10 is a graph showing the effect of the phase delay element of FIG. 9.

FIG. 10 is a graph 1000 showing the effect of the phase delay element of FIG. 9. The graph 1000 has a horizontal axis 1002 representing the back gate voltage, VBG_N of FIG. 9 and a vertical axis 1004 representing phase delta in degrees. The curve 1010 illustrates the effect on the phase as a function of varying the voltage, VBG_N of FIG. 9. The curve 1010 shows that the phase delay of the LO2 signal can be varied and controlled by varying the back gate voltage over a range of voltages. In another implementation, it is also possible for the voltage across the resistor 957 (FIG. 9) to change the Vdd of the inverter chain as well to change the delay. For example, in an alternative embodiment, the voltage VBG_N at node 953 across the resistor 957 can also or alternatively be provided as the VDD 963 of the inverter circuit 952 to control the delay provided by the delay circuit 950.

Figure 11:
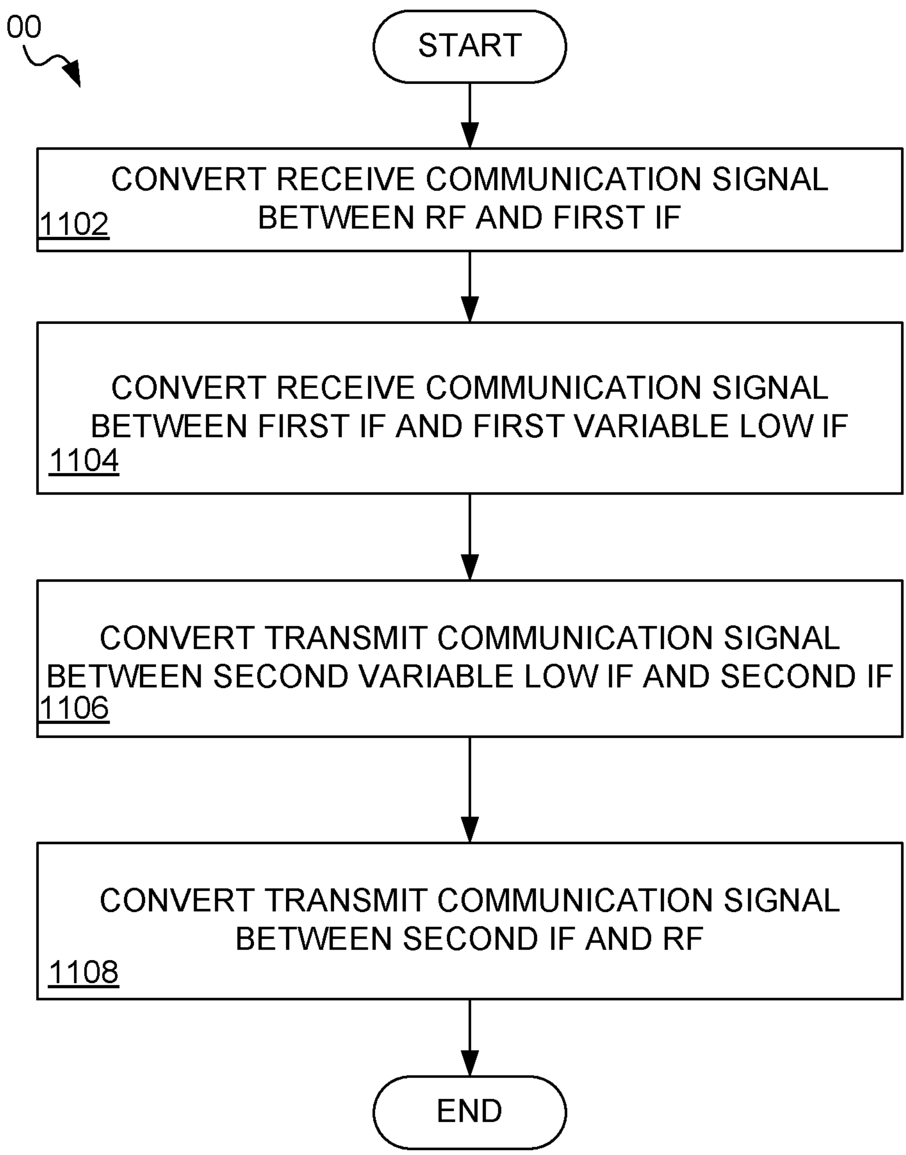
FIG. 11 is a flow chart describing an example of the operation of a method for signal conversion.

FIG. 11 is a flow chart 1100 describing an example of the operation of a method for signal conversion. The blocks in the method 1100 can be performed in or out of the order shown, and in some embodiments, can be performed at least in part in parallel.

In block 1102, a receive communication signal is converted between RF and a first IF. For example, a mixer 308 may receive a RF communication signal and convert the RF signal to a first IF signal.

In block 1104, the receive communication signal is converted between the first IF and a first variable low IF. For example, the mixer 313 may convert the receive communication signal from the first IF to a first variable low IF signal.

In block 1106, a transmit communication signal is converted between a second variable low IF and a second IF. For example, the mixer 350 may convert a transmit communication signal from a second variable low IF to a second IF.

In block 1108, a transmit communication signal is converted between the second IF and RF. For example, the mixer 345 may convert the second IF signal to an RF transmit communication signal.

Figure 12:
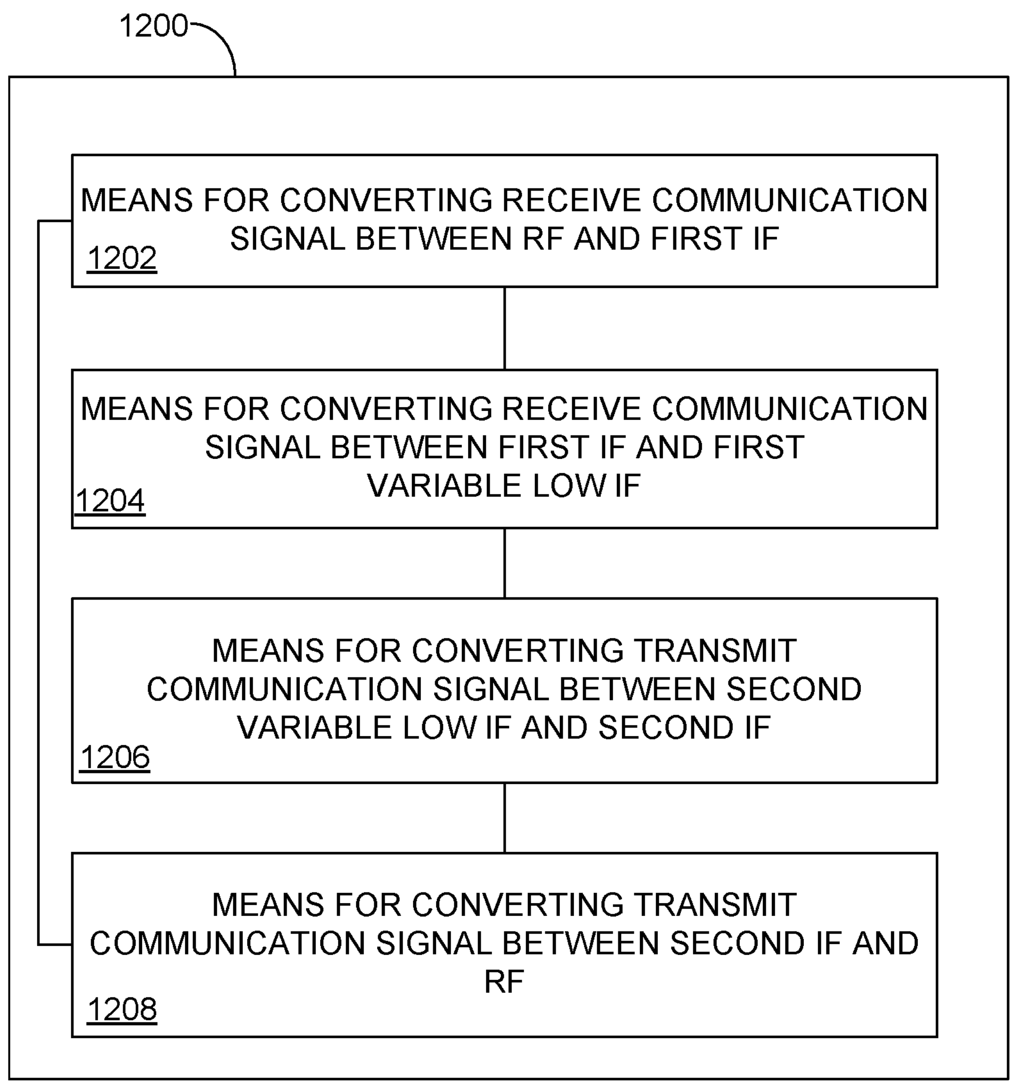
FIG. 12 is a functional block diagram of an apparatus for signal conversion.

FIG. 12 is a functional block diagram of an apparatus 1200 for signal conversion. The apparatus 1200 comprises means 1202 for converting a receive communication signal between RF and a first IF. In certain embodiments, the means 1202 for converting a receive communication signal between RF and a first IF can be configured to perform one or more of the functions described in operation block 1102 of method 1100 (FIG. 11). In an exemplary embodiment, the means 1202 for converting a receive communication signal between RF and a first IF may comprise the mixer 308 configured to receive an RF communication signal and convert the RF communication signal to a first IF signal.

The apparatus 1200 may also comprise means 1204 for converting the receive communication signal between the first IF and a first variable low IF. In certain embodiments, the means 1204 for converting the receive communication signal between the first IF and a first variable low IF can be configured to perform one or more of the functions described in operation block 1104 of method 1100 (FIG. 11). In an exemplary embodiment, the means 1204 for converting the receive communication signal between the first IF and a first variable low IF may comprise the mixer 313 configured to convert the receive communication signal from the first IF to a first variable low IF signal.

The apparatus 1200 may also comprise means 1206 for converting a transmit communication signal between a second variable low IF and a second IF. In certain embodiments, the means 1206 for converting a transmit communication signal between a second variable low IF and a second IF can be configured to perform one or more of the functions described in operation block 1106 of method 1100 (FIG. 11). In an exemplary embodiment, the means 1206 for converting a transmit communication signal between a second variable low IF and a second IF may comprise the mixer 350 configured to convert a transmit communication signal from a second variable low IF to a second IF.

The apparatus 1200 may also comprise means 1208 for converting a transmit communication signal between the second IF and RF. In certain embodiments, the means 1208 for converting a transmit communication signal between the second IF and RF can be configured to perform one or more of the functions described in operation block 1108 of method 1100 (FIG. 11). In an exemplary embodiment, the means 1208 for converting a transmit communication signal between the second IF and RF may comprise the mixer 345 configured to convert the second IF signal to an RF transmit communication signal.

Implementation Examples are Described in the Following Numbered Clauses:

1. A variable low intermediate frequency (VLIF), millimeter wave (mmW) communication system, comprising: a millimeter-wave (mmW) integrated circuit (mmw-IC) comprising: a receive section having a receive radio frequency (RF) conversion stage and a receive variable intermediate frequency (IF) conversion stage, the receive RF conversion stage configured to convert a receive communication signal between RF and a first receive IF; the receive variable IF conversion stage configured to convert the first receive IF signal to a first variable low IF signal; and a transmit section having a transmit variable IF conversion stage and a transmit RF conversion stage, the transmit variable IF conversion stage configured to convert a second variable low IF signal to a second IF signal, the transmit RF conversion stage configured to convert the second IF signal to an RF signal for transmission.
2. The communication system of clause 1, further comprising: an intermediate frequency integrated circuit (IFIC) comprising: a receive section having an amplifier, a radio frequency analog to digital converter (RF-ADC) and a digital downconverter (DDC); a transmit section having a digital upconverter (DUC), a radio frequency digital to analog converter (RF-DAC), and an amplifier; wherein the RF-ADC operates at the first variable low IF and the RF-DAC operates at the second variable low IF.
3. The communication system of any of clauses 1 through 2, wherein the first variable low IF and the second variable low IF are the same frequency.
4. The communication system of any of clauses 1 through 2, wherein the first variable low IF and the second variable low IF are different frequencies.
5. The communication system of any of clauses 1 through 4, wherein the mmW-IC further comprises: in the receive section, a complex bandpass filter, a receive polyphase filter, and a buffer; and in the transmit section, an amplifier, and a transmit polyphase filter.
6. The communication system of clause 5, wherein the receive polyphase filter is configured to convert the receive communication signal from complex to real and the transmit polyphase filter is configured to convert the transmit communication signal from real to complex.
7. The communication system of any of clauses 5 through 6, wherein the real receive signal and the real transmit signal are transferred between the mmW-IC and the IFIC.
8. The communication system of any of clause 5, wherein the transmit section of the mmW-IC further comprises a complex bandpass filter.
9. The communication system of clause 8, wherein the transmit polyphase filter is one of a 2-stage or a 3-stage polyphase filter and the complex bandpass filter is one of a 2nd or $3^{rd}$ order complex bandpass filter to filter negative image frequencies of a real signal.
10. The communication system of any of clauses 1 through 9, wherein the receive section comprises a first processing path configured to process a first channel and a second processing path configured to process a second channel; and wherein a local oscillator (LO) signal and in-phase (I) and quadrature (Q) signals are configured such that a first signal in the first channel is processed by a portion of the second processing path and a second signal in the second channel is processed by a portion of the first processing path so that the first signal and the second signal appear on opposite sides of the LO signal.
11. The communication system of any of clauses 1 through 10, wherein a frequency of the first variable low IF signal and a frequency of the second variable low IF signal are selected based on a bandwidth of the receive communication signal.
12. A method for processing communication signals, comprising: converting, at a millimeter wave integrated circuit (mmW-IC), a receive communication signal between a radio frequency (RF) and a first intermediate frequency (IF), and between the first IF and a first variable low IF (VLIF); and converting, at the mmW-IC, a transmit communication signal between a second variable low IF (VLIF) and a second IF, and between the second IF and RF.
13. The method of clause 12, wherein the first VLIF signal and second VLIF signal traverse between the mmW-IC and an intermediate frequency integrated circuit (IFIC).
14. The method of any of clauses 12 through 13, wherein the first variable low IF signal and the second variable low IF signal are the same frequency.
15. The method of any of clauses 12 through 13, wherein the first variable low IF signal and the second variable low IF signal are different frequencies.
16. The method of any of clauses 12 through 15, further comprising: converting, at the mmW-IC, the receive communication signal from complex to real; and converting, at the mmW-IC, the transmit communication signal from real to complex.
17. The method of clause 16, further comprising transferring the real receive signal and the real transmit signal between the mmW-IC and an intermediate frequency IC (IFIC).
18. The method of any of clauses 12 through 17, further comprising: processing a first channel in a first processing path and processing a second channel in a second processing path; and configuring a local oscillator (LO) signal and in-phase (I) and quadrature (Q) signals such that a first signal in the first channel is partially processed by the second processing path and a second signal in the second channel is partially processed by the first processing path so that the first signal and the second signal appear on opposite sides of the LO signal.
19. A device for processing communication signals, comprising: means for converting a receive communication signal between a radio frequency (RF) and a first intermediate frequency (IF), and between the first IF and a first variable low IF (VLIF); and means for converting a transmit communication signal between a second variable low IF (VLIF) and a second IF, and between the second IF and RF.

20. The device of clause 19, wherein only the first VLIF signal and second VLIF signal traverses between a millimeter wave integrated circuit (mmW-IC) and an intermediate frequency integrated circuit (IFIC).
21. The device of any of clauses 19 through 20, wherein the first variable low IF signal and the second variable low IF signal are the same frequency.
22. The device of any of clauses 19 through 20, wherein the first variable low IF signal and the second variable low IF signal are different frequencies.
23. The device of any of clauses 19 through 22, further comprising: means for converting the receive communication signal from complex to real; and means for converting the transmit communication signal from real to complex.
24. The device of clause 23, further comprising transferring the real receive signal and the real transmit signal between a millimeter wave integrated circuit (mmW-IC) and an intermediate frequency IC (IFIC).
25. The device of any of clauses 19 through 24, further comprising: means for processing a first channel in a first processing path and processing a second channel in a second processing path; and means for configuring a local oscillator (LO) signal and in-phase (I) and quadrature (Q) signals such that a first signal in the first channel is processed by the second processing path and a second signal in the second channel is processed by the first processing path so that the first signal and the second signal appear on opposite sides of the LO signal.
26. A millimeter wave (mmW) communication system, comprising: a mixer configured to downconvert a receive communication signal to a complex variable low IF signal; a signal processing section configured to convert the complex variable low IF signal to a real signal; and a node configured to output the real signal to a cable.
27. The millimeter wave (mmW) communication system of clause 26, further comprising a phase shifter having an output coupled to an input of the mixer, the phase shifter configured to receive a real mmW signal and output a real phase-shifted mmW signal.
28. The millimeter wave (mmW) communication system of clause 27, wherein the mixer comprises a first mixer and wherein the mmW communication system further comprises a second mixer, the second mixer configured to downconvert the real phase-shifted mmW signal to a real intermediate frequency signal and provide the real intermediate frequency signal as the receive communication signal to the first mixer.
29. The millimeter wave (mmW) communication system of any of clauses 27 through 28, further comprising a divider configured to provide a divided local oscillator (LO) signal comprising an in-phase signal and a quadrature signal to the first mixer, wherein the mixer is configured to downconvert the real intermediate frequency signal to the complex variable low IF signal.
30. The millimeter wave (mmW) communication system of any of clauses 26 through 29, wherein the complex variable low IF signal is differential, wherein the real signal is single ended, wherein the signal processing section comprises a polyphase filter coupled to an output of the mixer and configured to convert the differential complex variable low IF signal to a real differential signal, and wherein the signal processing section further comprises an amplifier configured to convert the real differential signal to the real single ended signal.

The circuit architecture described herein described herein may be implemented on one or more ICs, analog ICs. RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A variable low intermediate frequency (VLIF), millimeter wave (mmW) communication system, comprising:
- a millimeter-wave (mmW) integrated circuit (mmW-IC) comprising:
- a receive section having a receive radio frequency (RF) conversion stage and a receive variable intermediate frequency (IF) conversion stage, the receive RF conversion stage configured to convert a receive communication signal between RF and a first receive IF signal, the first receive IF signal being a lower frequency than an RF frequency of the receive communication signal; the receive variable IF conversion stage configured to convert the first receive IF signal to a first variable low IF signal, the first variable low IF signal having a frequency lower than a frequency of the first receive IF signal; and
- a transmit section having a transmit variable IF conversion stage and a transmit RF conversion stage, the transmit variable IF conversion stage configured to convert a second variable low IF signal to a second IF signal, the second IF signal having a frequency greater than a frequency of the second variable low IF signal, the transmit RF conversion stage configured to convert the second IF signal to an RF signal for transmission, the RF signal having a frequency greater than a frequency of the IF signal.

2. The communication system of claim 1, further comprising:
- an intermediate frequency integrated circuit (IFIC) comprising:
- a receive section having an amplifier, a radio frequency analog to digital converter (RF-ADC) and a digital downconverter (DDC);
- a transmit section having a digital upconverter (DUC), a radio frequency digital to analog converter (RF-DAC), and an amplifier;

wherein the RF-ADC operates at the first variable low IF and the RF-DAC operates at the second variable low IF.

3. The communication system of claim 2, wherein the mmW-IC further comprises:

in the receive section, a complex bandpass filter, a receive polyphase filter, and a buffer; and in the transmit section, an amplifier, and a transmit polyphase filter.

4. The communication system of claim 3, wherein the receive polyphase filter is configured to convert the receive communication signal from complex to real and the transmit polyphase filter is configured to convert the transmit communication signal from real to complex.

5. The communication system of claim 4, wherein the real receive signal and the real transmit signal are transferred between the mmW-IC and the IFIC.

6. The communication system of claim 3, wherein the transmit section of the mmW-IC further comprises a complex bandpass filter.

7. The communication system of claim 6, wherein the transmit polyphase filter is one of a 2-stage or a 3-stage polyphase filter and the complex bandpass filter in the transmit section of the mmW-IC is one of a 2nd or $3^{rd}$ order complex bandpass filter to filter negative image frequencies of a real signal.

8. The communication system of claim 1, wherein the first variable low IF and the second variable low IF are the same frequency.

9. The communication system of claim 1, wherein the first variable low IF and the second variable low IF are different frequencies.

10. The communication system of claim 1, wherein the receive section comprises a first processing path configured to process a first channel and a second processing path configured to process a second channel; and wherein a local oscillator (LO) signal and in-phase (I) and quadrature (Q) signals are configured such that a first signal in the first channel is processed by a portion of the second processing path and a second signal in the second channel is processed by a portion of the first processing path so that the first signal and the second signal appear on opposite sides of the LO signal.

11. The communication system of claim 1, wherein a frequency of the first variable low IF signal and a frequency of the second variable low IF signal are selected based on a bandwidth of the receive communication signal.

12. A method for processing communication signals, comprising:

converting, at a millimeter wave integrated circuit (mmW-IC), a receive communication signal between a radio frequency (RF) and a first intermediate frequency (IF), the IF having a frequency lower than a frequency of the RE, and between the first IF and a first variable low IF (VLIF), the first variable low IF having a frequency that is lower than a frequency of the first IF; and converting, at the mmW-IC, a transmit communication signal between a second variable low IF (VLIF) and a second IF, the second IF having a frequency that is higher than a frequency of the second variable low IF, and between the second IF and RF, the RF having a frequency that is higher than a frequency of the second IF.

13. The method of claim 12, wherein the first VLIF signal and second VLIF signal traverse between the mmW-IC and an intermediate frequency integrated circuit (IFIC).

14. The method of claim 12, wherein the first variable low IF signal and the second variable low IF signal are the same frequency.

15. The method of claim 12, wherein the first variable low IF signal and the second variable low IF signal are different frequencies.

16. The method of claim 12, further comprising:

converting, at the mmW-IC, the receive communication signal from complex to real; and converting, at the mmW-IC, the transmit communication signal from real to complex.

17. The method of claim 16, further comprising transferring the real receive signal and the real transmit signal between the mmW-IC and an intermediate frequency IC (IFIC).

18. The method of claim 12, further comprising:

processing a first channel in a first processing path and processing a second channel in a second processing path; and configuring a local oscillator (LO) signal and in-phase (I) and quadrature (Q) signals such that a first signal in the first channel is partially processed by the second processing path and a second signal in the second channel is partially processed by the first processing path so that the first signal and the second signal appear on opposite sides of the LO signal.

19. A device for processing communication signals, comprising:

means for converting a receive communication signal between a radio frequency (RF) and a first intermediate frequency (IF)), the IF having a frequency lower than a frequency of the RF, and between the first IF and a first variable low IF (VLIF), the first variable low IF having a frequency that is lower than a frequency of the first IF; and means for converting a transmit communication signal between a second variable low IF (VLIF) and a second IF, the second IF having a frequency that is higher than a frequency of the second variable low IF, and between the second IF and RF, the RF having a frequency that is higher than a frequency of the second IF.

20. The device of claim 19, wherein only the first VLIF signal and second VLIF signal traverses between a millimeter wave integrated circuit (mmW-IC) and an intermediate frequency integrated circuit (IFIC).

21. The device of claim 19, wherein the first variable low IF signal and the second variable low IF signal are the same frequency.

22. The device of claim 19, wherein the first variable low IF signal and the second variable low IF signal are different frequencies.

23. The device of claim 19, further comprising:

means for converting the receive communication signal from complex to real; and means for converting the transmit communication signal from real to complex.

24. The device of claim 23, further comprising transferring the real receive signal and the real transmit signal between a millimeter wave integrated circuit (mmW-IC) and an intermediate frequency IC (IFIC).

25. The device of claim 19, further comprising:

means for processing a first channel in a first processing path and processing a second channel in a second processing path; and means for configuring a local oscillator (LO) signal and in-phase (I) and quadrature (Q) signals such that a first signal in the first channel is processed by the second processing path and a second signal in the second channel is processed by the first processing path so that the first signal and the second signal appear on opposite sides of the LO signal.

* * * * *